US012327739B2

(12) United States Patent
Kobashi et al.

(10) Patent No.: US 12,327,739 B2
(45) Date of Patent: Jun. 10, 2025

(54) DIE BONDING APPARATUS AND MANUFACTURING METHOD FOR SEMICONDUCTOR APPARATUS

(71) Applicant: Fasford Technology Co., Ltd., Minami-Alps (JP)

(72) Inventors: Hideharu Kobashi, Minami-Alps (JP); Masayuki Mochizuki, Minami-Alps (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 548 days.

(21) Appl. No.: 17/643,610

(22) Filed: Dec. 10, 2021

(65) Prior Publication Data
US 2022/0199433 A1    Jun. 23, 2022

(30) Foreign Application Priority Data
Dec. 21, 2020 (JP) .................................. 2020-211779

(51) Int. Cl.
*H01L 21/67* (2006.01)
*G06T 7/00* (2017.01)
(Continued)

(52) U.S. Cl.
CPC ........ *H01L 21/67092* (2013.01); *G06T 7/001* (2013.01); *G06T 7/74* (2017.01);
(Continued)

(58) Field of Classification Search
CPC ......... H01L 21/67092; H01L 21/67259; H01L 21/67144; H01L 21/681; H01L 21/52;
(Continued)

(56) References Cited

U.S. PATENT DOCUMENTS 3,844,655 A * 10/1974 Johannsmeier ....... G03F 9/7069
                                                                    355/95
4,213,117 A *  7/1980 Kembo ................. H01L 23/544
                                                                257/E23.179
(Continued)

FOREIGN PATENT DOCUMENTS

JP          2013-51278 A      3/2013
JP          2017-117916 A     6/2017
(Continued)

OTHER PUBLICATIONS

English translation of Korean-language Office Action issued in Korean Application No. 10-2021-0176633 dated Jun. 23, 2023 (14 pages).

*Primary Examiner* — Kathleen Y Dulaney
(74) *Attorney, Agent, or Firm* — Crowell & Moring LLP

(57) ABSTRACT

A die bonding apparatus includes a control device for controlling an imaging device. The control device is configured to: detect the dicing grooves by photographing the wafer using the imaging device; roughly determine a central position of the die by calculating the center coordinate of the die on the basis of the detected dicing grooves; move a center of the die to a center of an optical axis of the imaging device on the basis of the center coordinate; photograph the moved die by the imaging device and detect positions of pads possessed by the die on the basis of an image of the photographed die; detect a specific pad arrangement having a unique pitch on the basis of the detected dispositions of the pads; and register the detected specific pad arrangement as a template model.

7 Claims, 20 Drawing Sheets

(51) Int. Cl.
   *G06T 7/73* (2017.01)
   *H04N 23/56* (2023.01)
   *H04N 23/90* (2023.01)

(52) U.S. Cl.
   CPC ....... *H01L 21/67259* (2013.01); *H04N 23/56* (2023.01); *H04N 23/90* (2023.01); *G06T 2207/30148* (2013.01)

(58) Field of Classification Search
   CPC ........... H01L 21/67721; H01L 21/6835; H01L 21/6838; H01L 2221/68368; G06T 7/001; G06T 7/74; G06T 2207/30148; H04N 23/56; H04N 23/90; H04N 23/61; H04N 23/80; H05K 13/0404
   USPC .................. 382/145, 151; 250/557; 356/400
   See application file for complete search history.

(56) References Cited

U.S. PATENT DOCUMENTS

| | | | | |
|---|---|---|---|---|
| 4,362,389 A | * | 12/1982 | Koizumi | G03F 9/70 356/150 |
| 4,414,749 A | * | 11/1983 | Johannsmeier | G03F 9/70 382/151 |
| 4,531,060 A | * | 7/1985 | Suwa | G03F 9/70 250/548 |
| 4,720,635 A | * | 1/1988 | Uga | H01L 21/67271 250/548 |
| 5,760,411 A | * | 6/1998 | Kawakubo | G03F 9/70 250/548 |
| 5,805,866 A | * | 9/1998 | Magome | G03F 9/70 716/51 |
| 2007/0041015 A1 | * | 2/2007 | Van Bilsen | G03F 9/7065 356/401 |
| 2008/0014073 A1 | * | 1/2008 | Moore | H01L 21/67271 414/796 |
| 2009/0189054 A1 | * | 7/2009 | Campidell | H01L 21/67282 250/206 |
| 2010/0245792 A1 | * | 9/2010 | Bijnen | G03F 9/7046 348/135 |
| 2018/0122669 A1 | * | 5/2018 | Wu | H01L 21/67259 |
| 2018/0164696 A1 | | 6/2018 | Moriya et al. | |
| 2021/0097670 A1 | * | 4/2021 | Iinuma | G01N 21/9501 |
| 2023/0055977 A1 | * | 2/2023 | Li | H10B 12/00 |

FOREIGN PATENT DOCUMENTS

| | | |
|---|---|---|
| JP | 2018-152375 A | 9/2018 |
| KR | 10-2018-0068289 A | 6/2018 |

* cited by examiner

DIE BONDING APPARATUS AND MANUFACTURING METHOD FOR SEMICONDUCTOR APPARATUS

CLAIM OF PRIORITY

The present application claims priority from Japanese patent application JP2020-211779 filed on Dec. 21, 2020, the content of which is hereby incorporated by reference into this application.

BACKGROUND

The present disclosure relates to die bonding apparatuses, and the present disclosure can be applied to, for example, die bonders in which positioning is performed using template matching.

A die bonding apparatus such as a die bonder, that is, one of semiconductor manufacturing apparatuses is an apparatus used for bonding a semiconductor chip (hereinafter, referred to as a die for simplicity) on a wiring board, a lead frame, or the like (hereinafter, referred to as a substrate for simplicity) or for bonding (mounting and attaching) a die to a die that has already been bonded. In the die bonding apparatus, a pickup head or a bonding head sucks a die by vacuum suction, moves up in a high speed, moves horizontally, and moves down to mount the die on an intermediate stage or on a substrate.

When a pickup head or a bonding head sucks a die by vacuum suction, the die is required to be picked up without fail. Along with the recent trend toward the reduction of the thicknesses of dice, the above requirement has increasing significantly. Therefore, after the position of a die is recognized, the misalignment of the die is detected, the position of the die or that of a bonding head is corrected, and the die is picked up.

As one of methods for recognizing the position of a die, there is a method for recognizing the position of a die by performing pattern matching (template matching) between photographed data regarding a unique portion such as a die position alignment marking or a pad for wire bonding and a template obtained by a teaching in advance, for example.

SUMMARY

For example, Japanese Unexamined Patent Application Publication No. 2017-117916 discloses a technology in which the above unique portion is selected by an operator of a die bonder using a GUI or the like. The registration area of models (unique portions) for template matching is determined by a human being.

An object of the present disclosure is to provide a technology that enables the registration operation of models for template matching to be automatically performed.

The outline of a typical die bonding apparatus included in the present disclosure is briefly described as follows. To put it concretely, the die bonding apparatus includes a control device for controlling an imaging device.

The control device is configured to: detect dicing grooves by photographing the wafer using the imaging device; roughly determine a central position of the die by calculating a center coordinate of the die on the basis of the detected dicing grooves; move a center of the die to a center of an optical axis of the imaging device on the basis of the center coordinate; photograph the moved die by the imaging device and detect positions of pads possessed by the die on the basis of an image of the photographed die; detect a specific pad arrangement having a unique pitch on the basis of the detected dispositions of the pads; and register the detected specific pad arrangement as a template model.

According to the above die bonding apparatus, it becomes possible to automatically execute the registering operation of a model for template matching.

DESCRIPTION OF THE PREFERRED EMBODIMENTS

Hereinafter, an embodiment and modifications will be explained with reference to the accompanying drawings. In the following descriptions, the same components are given the same reference signs, and repetitive explanations will be omitted in some cases. In addition, there are some cases where, in order to make the descriptions easier to understand in the accompanying drawings, the widths, thicknesses, shapes, and the like of respective portions of the embodiments are schematically depicted differently from what the embodiments really are, but these depictions are only examples, so that the interpretation of the present disclosure is not limited to these depictions.

Embodiment

Figure 1:
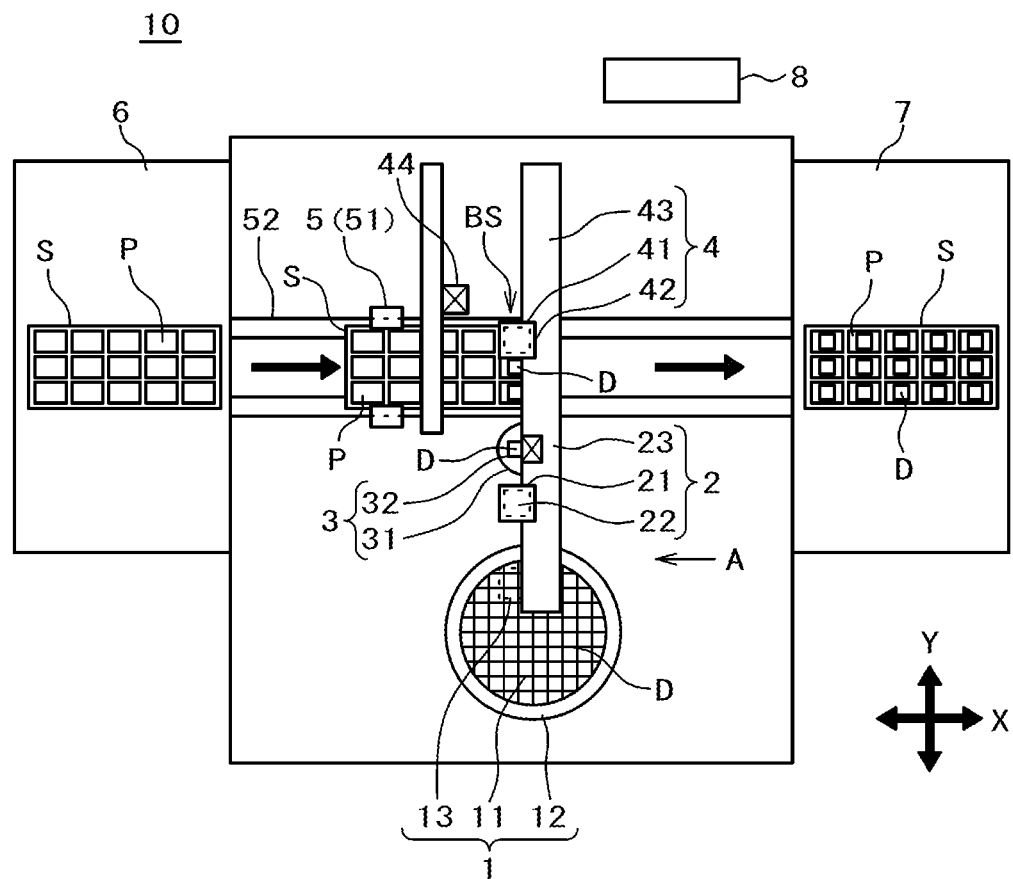
FIG. 1 is a schematic top view showing a configuration example of a die bonder according to an embodiment.
Figure 2:
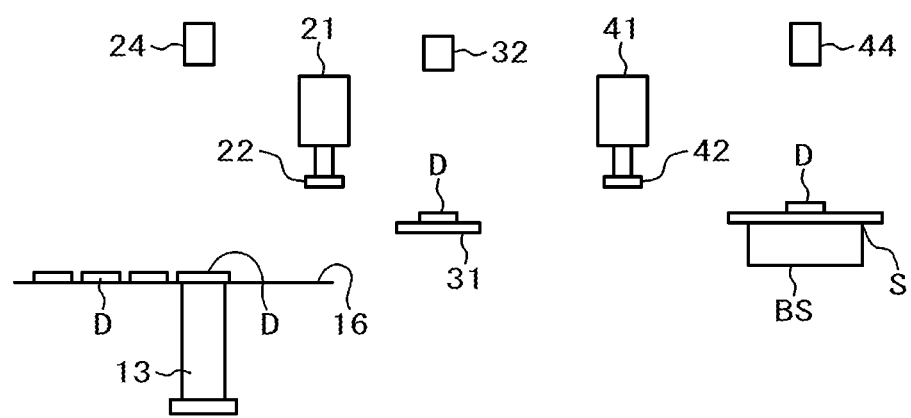
FIG. 2 is a diagram used for explaining a schematic configuration viewed from an arrow A in FIG. 1.

FIG. 1 is a schematic top view showing a configuration example of a die bonder according to an embodiment. FIG. 2 is a diagram used for explaining a schematic configuration viewed from an arrow A in FIG. 1.

Schematically describing, the die bonder 10 includes: a die feed section 1 that feeds dice D to be mounted on a substrate S; a pickup section 2; an intermediate stage section 3; a bonding section 4; a transfer section 5; a substrate feed section 6; a substrate carrying-out section 7; and a control section 8 that monitors and controls the behaviors of the respective sections. The Y axis direction is a direction along which the die bonder 10 moves back and forth, and the X axis direction is a direction along which the die bonder 10 moves left and right. The die feed section 1 is disposed on the front portion of the die bonder 10, and the bonding section 4 is disposed on the rear portion. In this case, one or more product areas (hereinafter, referred to as a package area or package areas P), each of which finally becomes a package, are printed on the substrate S.

First, the die feed section 1 feeds a die D to be mounted on a package area P of the substrate S. The die feed section 1 includes: a wafer holder 12 for holding a wafer 11; a push-up unit 13 that pushes up a die D from the wafer 11 and is shown in dashed lines. The die feed section 1 is moved in the X axis direction or Y axis direction by an unshown drive means, and moves a die D to be picked up to the position of the push-up unit 13. Here, the wafer is divided into plural dice D, and the dice D are held on the outer rim of the wafer 11 by an after-mentioned dicing tape 16.

The pickup section 2 includes: a pickup head 21 for picking up a die D; a Y drive section 23 of the pickup head for moving the pickup head 21 in the Y axis direction; plural drive sections (not shown) for moving a collet 22 up and down, rotating the collet 22, and moving the collet 22 in the X axis direction respectively. The pickup head 21 includes the collet (also see FIG. 2) for sucking and holding a pushed-up die D at its tip, and picks up the die D from the die feed section 1 to mount the die D on an intermediate stage 31. The pickup head 21 includes plural drive sections (not shown) for moving the collet 22 up and down, rotating the collet 22, and moving the collet 22 in the X direction respectively.

The intermediate stage section 3 includes: the intermediate stage 31 for temporally mount a die D; and a stage recognition camera 32 for recognizing the die D on the intermediate stage 31.

The bonding section 4 picks up the die D from the intermediate stage 31, and bonds the die D on a package area P of a transferred substrate S or bonds the die D on a die already bonded on the package area P of the substrate S in such a manner that these dice are laminated. The bonding section 4 includes: a bonding head 41 having a collet 42 (also see FIG. 2) for sucking and holding a die D at its tip as is the case with the pickup head 21; a Y drive section 43 for moving the bonding head 41 in the Y axis direction; a substrate recognition camera 44 for photographing the position recognition marking (not shown) of a package area P of a substrate S to recognize a bonding position in the package area P; and an XY drive section 45 for driving the substrate recognition camera 44 in the X axis direction or the Y axis direction. With such a configuration, the bonding head 41 corrects the pickup position/posture of the die on the basis of the photographed data of the stage recognition camera 32, picks up a die D from the intermediate stage 31, and bonds the die D on a substrate S on the basis of the photographed data of the substrate recognition camera 44.

The transfer section 5 includes: substrate transfer claws 51 used for clawing and transferring a substrate S; and a transfer lane 52 along which the substrate S is transferred. The substrate S is transferred by driving unshown nuts of the substrate transfer claws 51 fixed to the transfer lane 52 by unshown ball screws fixed along the transfer lane 52. With the use of such a configuration, the substrate S is moved from the substrate feed section 6 to the bonding position along the transfer lane 52, and after the die D is bonded, the substrate S is moved to the substrate carrying-out section 7, and is passed to the substrate carrying-out section 7.

Figure 3:
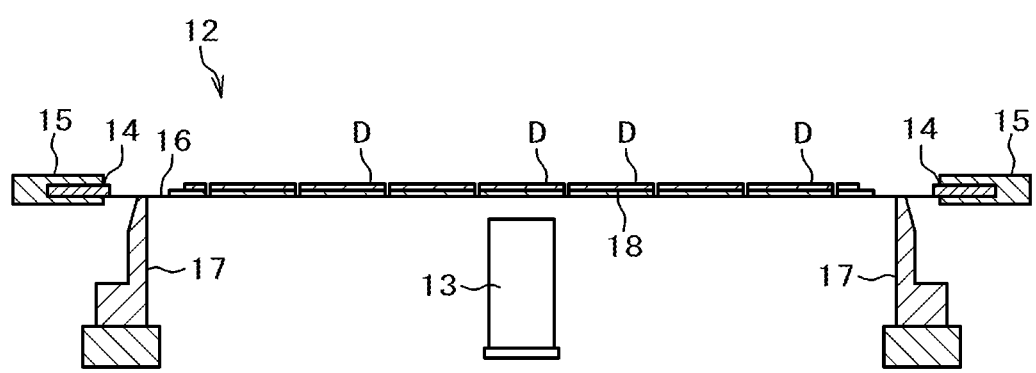
FIG. 3 is a schematic cross-sectional view showing the main part of a die feed section shown in FIG. 1.

Next, the configuration of the die feed section 1 will be explained with reference to FIG. 3. FIG. 3 is a schematic cross-sectional view showing the main part of the die feed section shown in FIG. 1.

The die feed section 1 includes: the wafer holder 12 that moves in the horizontal direction (the X axis direction or Y axis direction); and the push-up unit 13 that moves up and down. The wafer holder 12 includes: an expand ring 15 that holds a wafer ring 14; and a support ring 17 that horizontally positions a dicing tape 16 that is held by the wafer ring 14 and to which plural dices D are bonded. The push-up unit 13 is disposed inside the support ring 17.

When the die feed section 1 pushes up a die D, the die feed section 1 brings down the expand ring 15 that supports the wafer ring 14. As a result, the dicing tape 16 supported by the wafer ring 14 is stretched, spaces among dice D are expanded, and the die D is pushed up from under the die D itself by the push-up unit 13, which improves die D picked-up performance. Here, a film-shaped bonding material called a die attach film (DAF) 18 is attached to the wafer 11 and the dicing tape 16 so as to be sandwiched in between the wafer 11 and the dicing tape 16. If a wafer 11 includes a die attach film 18, dicing is executed on both wafer 11 and die attach films 18. Therefore, in the relevant peeling step, the wafer 11 and the die attach film 18 are peeled off from the dicing tape 16.

The die bonder 10 includes a wafer recognition camera 24 as an imaging device that recognizes the posture and position of a die D on the wafer 11; the stage recognition camera 32 for recognizing the posture and position of a die D on the intermediate stage 31 as a second imaging device; and the substrate recognition camera 44 for recognizing the mounting position of the die on a bonding stage BS as a third imaging device. As for the postures of the above recognition cameras, what needs to be corrected is a misalignment between the posture of the stage recognition camera 32 involved in the pickup executed by the bonding head 41 and the posture of the substrate recognition camera 44 involved in the bonding the die to the mounting position performed by the bonding head 41.

In the present embodiment, not only the wafer recognition camera 24, the stage recognition camera 32, and the substrate recognition camera 44, but also a coaxial illumination 26 (see FIG. 15) and the like are used for performing the positioning and the surface inspection of a die D.

Figure 4:
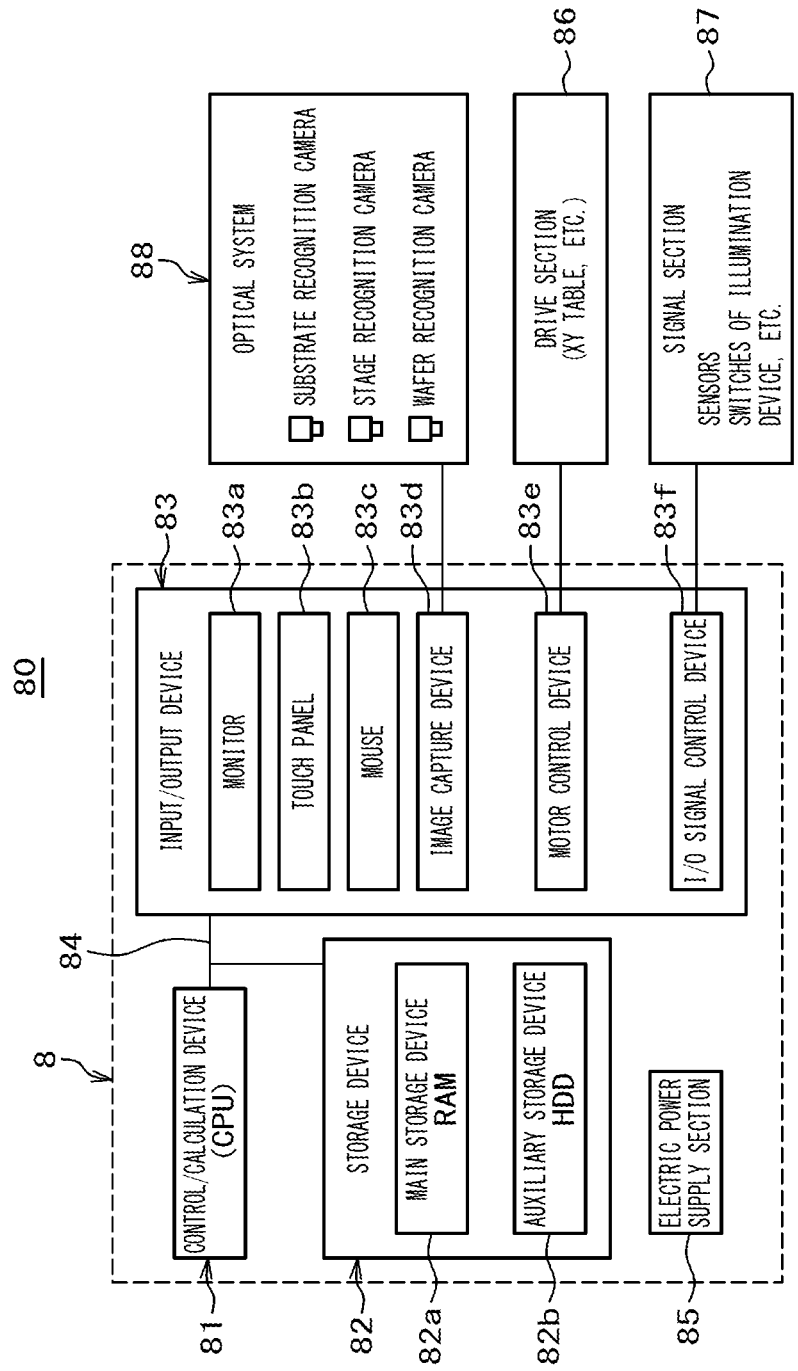
FIG. 4 is a block diagram showing the schematic configuration of the control system of the die bonder shown in FIG. 1.

Next, the control section 8 will be explained with reference to FIG. 4. FIG. 4 is a block diagram showing the schematic configuration of a control system of the die bonder shown in FIG. 1.

The control system 80 includes: the control section (control device) 8; a drive section 86; a signal section 87; and an optical system 88. Schematically speaking, the control section 8 includes: a control/calculation device 81 mainly composed of a CPU (Central Processor Unit); a storage device 82; an input/output device 83; a bus line 84; and an electric power supply section 85. The storage device 82 includes: a main storage device 82a composed of RAMS (Random Access Memories) that store processing programs and the like; an auxiliary storage device 82b composed of an HDD, an SSD, and the like that store control data necessary for control, image data, and the like. The input/output device 83 includes: a monitor 83a for displaying the states of devices, information, and the like; a touch panel 83b into which an operator inputs his/her instructions; a mouse 83c used for operating the monitor; and an image capture device 83d for capturing image data from the optical system 88. Furthermore, the input/output device 83 further includes: a motor control device 83e for controlling a drive section 86 including the XY table (not shown) of the die feed section 1, the ZY drive axis of a bonding head table, the XY drive axis of the substrate recognition camera, and the like; and an I/O signal control device 83f for capturing or controlling signals transmitted from a signal section 87 including various sensors and the switches and the like of an illumination device and the like. The optical system 88 includes: the wafer recognition camera 24; the stage recognition camera 32; and the substrate recognition camera 44. The control/calculation device 81 captures necessary data via the bus line 84, calculates the data, and controls the pickup head 21 and the like or send information to the monitor 83a or the like.

The control section 8 stores image data photographed by the wafer recognition camera 24, the stage recognition camera 32, and the substrate recognition camera 44 in the storage device 82 via the image capture device 83d. The positioning of a die D and the package area P of a substrate S and the surface inspection of the die D and the substrate S are executed on the basis of the stored image data by programed software using the control/calculation device 81. The drive section 86 is operated by software via the motor control device 83e on the basis of the positions of the die D and the package area P of the substrate S calculated by the control/calculation device 81. Through this process, the positioning of the die on the wafer is performed, and the die D is bonded on the package area P of the substrate S through the operations of the drive sections of the pickup section 2 and the bonding section 4. The wafer recognition camera 24, the stage recognition camera 32, and the substrate recognition camera 44 used in this case are compatible with gray scale, color, or the like, and these cameras digitize light intensities.

Figure 5:
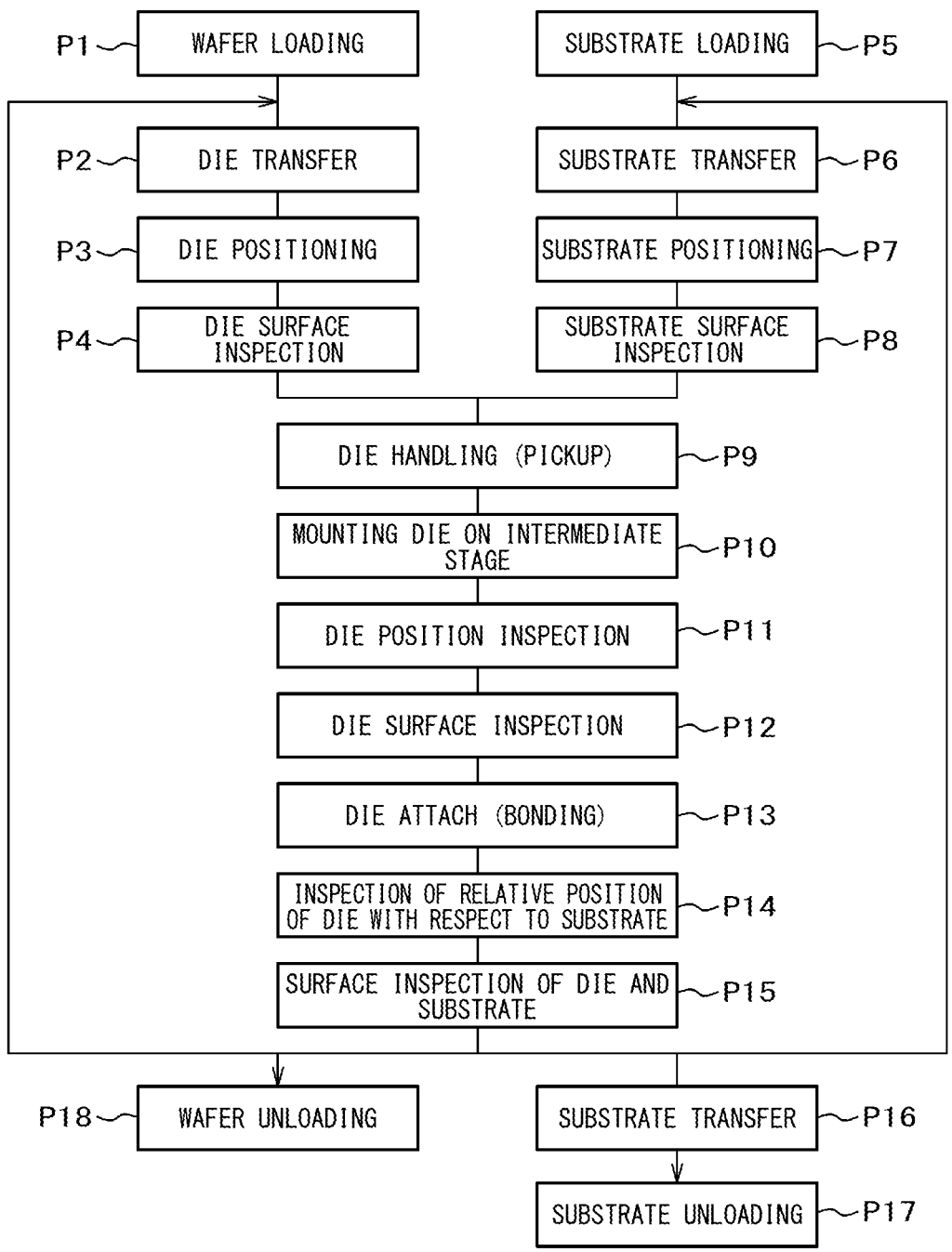
FIG. 5 is a flowchart used for explaining a die bonding process in the die bonder shown in FIG. 1.

Next, a die bonding process (a part of a manufacturing method of a semiconductor device) will be explained with reference to FIG. 5. FIG. 5 is a flowchart used for explaining the die bonding process in the die bonder shown in FIG. 1. In the bonding process in the present embodiment, first the wafer ring 14 that holds the dicing tape 16 to which a die D separated from the wafer 11 is attached is stored in a wafer cassette (not shown), and the wafer cassette is carried in the die bonder 10. In addition, a substrate S is prepared and carried in the die bonder 10.

(Wafer Loading: Process P1)

The control section 8 brings out the wafer ring 14 holding the wafer 11 from the wafer cassette, mounts the wafer ring 14 on the wafer holder 12, and transfers the wafer holder 12 to a reference position where a die D is picked up.

(Die Transfer: Process P2)

Next, the control section 8 moves the wafer holder 12 on which the wafer 11 is mounted at predefined pitches and keeps the wafer holder horizontal, so that a die D to be picked up first is disposed in the relevant pickup position. Here, the pickup position of the die D is also the recognition position of the die D recognized by the wafer recognition camera 24. As for the inspection of the wafer 11, every die on the wafer is inspected in advance by an inspection device such as a prover, and map data that shows the good or bad for every die is created, and the map data is stored in the storage device 82 of the control 8. Judgment of whether the pickup target die D is good or bad is executed on the basis of the relevant map data or a bad marking on the surface of the die. If the die D is bad, the control section 8 moves the wafer holder 12 on which the wafer 11 is mounted at the predefined pitches, and disposes a die D to be picked up next in the relevant pickup position, and skips the bad die D.

(Die Positioning: Process P3)

Next, the control section 8 photographs the main surface (upper surface) of the pickup target die D using the wafer recognition camera 24 and obtains the image of the die D. Although details will be described later, the control section 8 calculates the positional misalignment amount of the pickup target die D from the pickup position, and measures the position of the die D with reference to the obtained image. The control section 8 moves the wafer holder 12 on which the wafer 11 is mounted on the basis of this positional misalignment amount, and accurately disposes the pickup target die D in the pickup position.

(Die Surface Inspection: Process P4)

Next, the control section 8 executes the surface inspection of the pickup target die D on the basis of the image obtained by the wafer recognition camera 24. Here, if the control section 8 judges that there is no problem regarding the surface of the die D, the control section 8 executes the after-mentioned die crack inspection, and then the flow proceeds to the next process (after-mentioned Process P9), but if it is judged that there is any problem, skip processing or error stop processing is executed. In the skip processing, Process P9 and subsequent processes regarding the die D are skipped, and the flow proceeds to Process P2.

(Substrate Loading: Process P5, Substrate Transfer: Process P6)

The control section 8 mounts a substrate S on the transfer lane 52 using the substrate feed section 6. The control section 8 moves the substrate transfer claws 51, which claw and transfer the substrate S, to the bonding position.

(Substrate Positioning: Process P7)

Next, the control section 8 moves the substrate recognition camera 44 to the photographing position of a bonding target package area P (a bonding tab photographing position). The control section 8 photographs the substrate S using the substrate recognition camera 44, and obtains an image. With reference to the obtained image, the positional misalignment amount of the package area P of the substrate S is calculated, and the position of the substrate S is measured. The control section 8 moves the substrate S on the basis of this positional misalignment amount, and performs positioning for accurately disposing the bonding target package area P in the bonding position or the adjustment of the bonding position.

(Substrate Surface Inspection: Process P8)

Next, the control section 8 executes the surface inspection of the package area P of the substrate S on the basis of the image obtained by the substrate recognition camera 44. Here, the control section 8 judges whether there is any problem or not in the surface inspection, and if the control section 8 judges that there is no problem regarding the surface of the package area P of the substrate S, the flow proceeds to the next step (after-mentioned Process P9), but if it is judged that there is any problem, the image of the surface of the package area P is checked with eyes, or the image of the surface of the package area P is checked using an inspection with higher sensitivity, inspection under a different illumination condition or the like. And in the case where there is any problem just the same, skip processing is performed. If there is no problem, the flow proceeds to the processing of the next step. In the skip processing, Process P13 and subsequent processes regarding the relevant tab of the package area P of the substrate S are skipped, and information to the effect that the surface of the package area P is defective is registered in substrate inspection information.

(Die Handling: Process P9, Mounting Die on Intermediate Stage: Process P10)

After accurately disposing the pickup target die D in the pickup position using the die feed section 1, the control section 8 picks up the die D from the dicing tape 16 using the pickup head 21 with the collet 22 and mounts the die D on the intermediate stage 31.

(Die Position Inspection: Process P11)

The control section 8 detects the postural misalignment (rotational misalignment) of the die mounted on the intermediate stage 31 by photographing the die using the stage recognition camera 32. The control section 8 photographs the main surface (top surface) of the die D using the stage recognition camera 32 and obtains the image of the die D. Although details will be described later, the control section 8 calculates the positional misalignment amount of the die D from the obtained image, and measures the position of the die D. If there is the postural misalignment, the control section 8 turns the intermediate stage 31 in a plane parallel to a mounting plane including the mounting position of the die to correct the postural misalignment using a turning drive device (not shown) fixed to the intermediate stage 31.

(Die Surface Inspection: Process P12)

The control section 8 executes the surface inspection of the die D on the basis of the image obtained by the stage recognition camera 32. Here, if the control section 8 judges that there is no problem regarding the surface of the die D, the control section 8 executes a die crack inspection, and the flow proceeds to the next process (the after-mentioned Process P13), but if it is judged that there is any problem, skip processing or error stop processing is performed. In the skip processing, after the die is mounted on an unshown defective product tray or the like, Process P13 and subsequent processes regarding the die D are skipped, and the flow proceeds to Process P2.

(Die Attach: Process P13)

The control section 8 picks up the die D from the intermediate stage 31 using the bonding head 41 including the collet 42, and bonds the picked-up die D to the package area P of the substrate S or to a die that has already been bonded to the package area P of the substrate S.

(Inspection of Relative Position of Die with Respect to Substrate: Process P14)

Next, the control section 8 photographs the die D using the substrate recognition camera 44 and obtains the image of the die D. Although details will be described later, the control section 8 calculates the positional misalignment amount of the die D from the obtained image, and measures the position of the die D. After bonding the die D, the control section 8 checks whether or not the position to which the die D is bonded is accurate. In this case, as is the case with the die position alignment, the center of the die and the center of the tab are calculated, and whether or not the relative position of the center of the die with respect to the center of the tab is accurate is checked.

(Surface Inspection of Die and Substrate: Process P15)

The control section 8 executes the surface inspection of the die D on the basis of the image obtained by the substrate recognition camera 44. Here, if the control section 8 judges that there is no problem regarding the surface of the die D, the flow proceeds to the next process (Process P2), but if it is judged that there is any problem, skip processing or error stop processing is performed. In the skip processing, information to the effect that the surface of the die D is defective is registered in the substrate inspection information, and the flow proceeds to Process P2.

(Substrate Transfer: Process P16, Substrate Unloading: Process P17)

Hereinafter, according to the same procedure as described above, plural dice D are bonded on the same number of package areas P of the substrate S on a one-to-one basis. After the bonding for one substrate S is finished, the substrate S is moved to the substrate carrying-out section 7 by the substrate transfer claws 51, and is passed to the substrate carrying-out section 7.

(Wafer Unloading: Process P18)

Hereinafter, according to the same procedure as described above, the dice D are peeled off from the dicing tape 16 one-by-one (Process P9). After the pickup of all the dice D belonging to the relevant production category is finished, the dicing tape 16 and the wafer ring 14 that hold those dice D on the outer rim of the wafer 11, and the like are unloaded in the wafer cassette.

As described above, the dice D are mounted on the substrate S via die attach films 18 respectively, and are carried out from the die bonder. And then, the dice D are electrically connected to the electrodes of the substrate S via Au wires in a wire bonding process. In the case of laminated components being produced, the substrate S on which dice D are mounted is carried in the die bonder again, and second dice D are laminated on the dice D already mounted on the substrate S via die attach films 18 respectively. After the substrate S on which the dice D and the second dice D are laminated is carried out from the die bonder, the dice D and the second dice D are electrically connected to the electrodes of the substrate S via Au wires respectively in the wire bonding process. After being peeled off from dicing tape 16 in the abovementioned way, the second dice D are transferred to a pellet bonding process, and are laminated on the already-mounted dice D respectively. After the above processes are repeated predefined times, the substrate S is transferred to a mold process, and plural dice D and Au wires are sealed by mold resin (not shown), so that laminated packages are completed.

Figure 6:
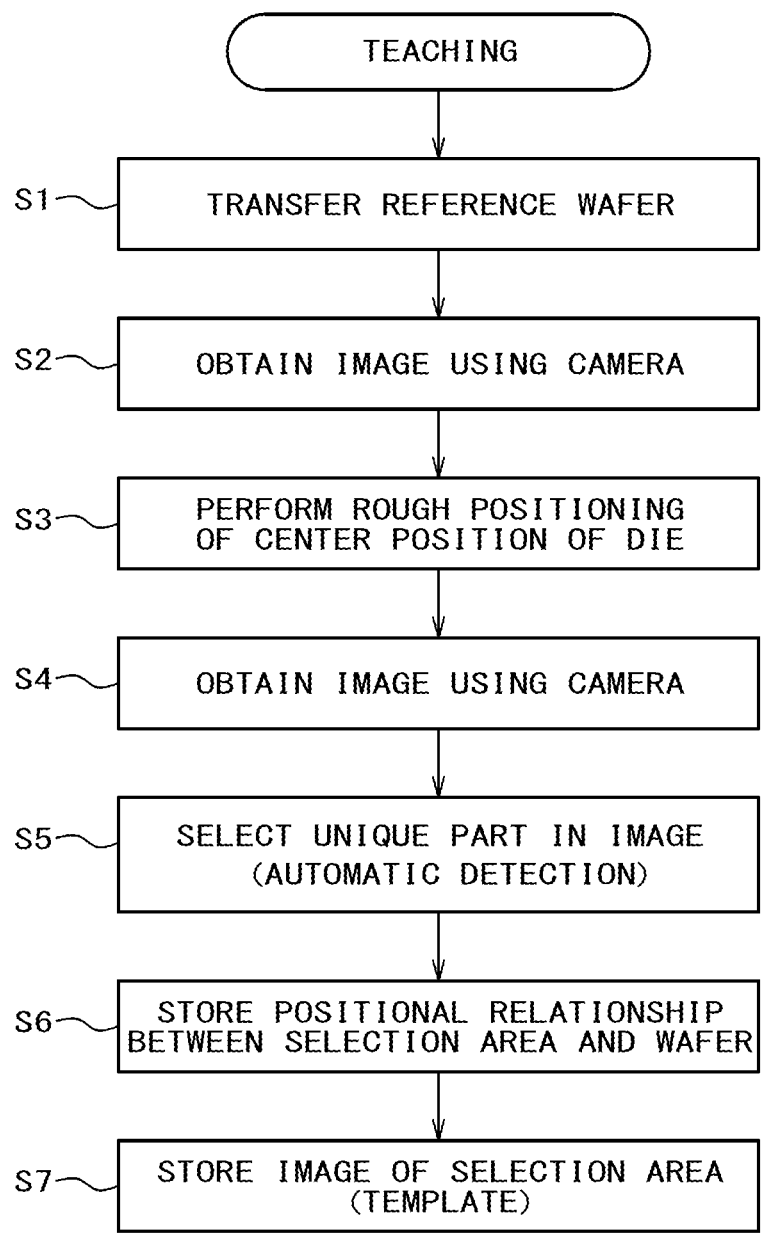
FIG. 6 is a flowchart used for explaining a teaching.
Figure 7:
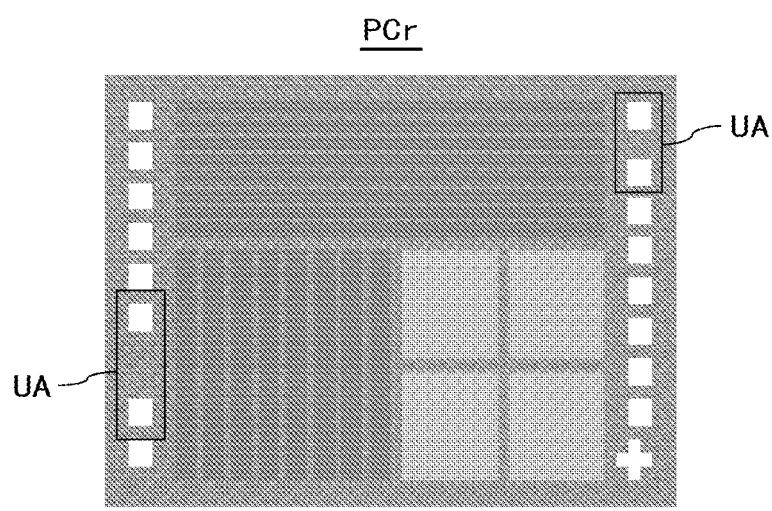
FIG. 7 is a diagram showing examples of unique portions (selection areas)
Figure 8:
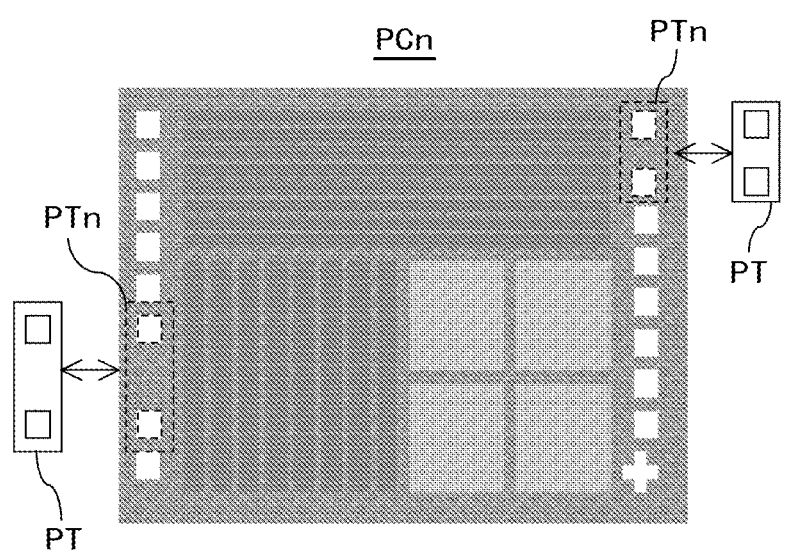
FIG. 8 is a diagram showing examples of registered images and analogous images.
Figure 9:
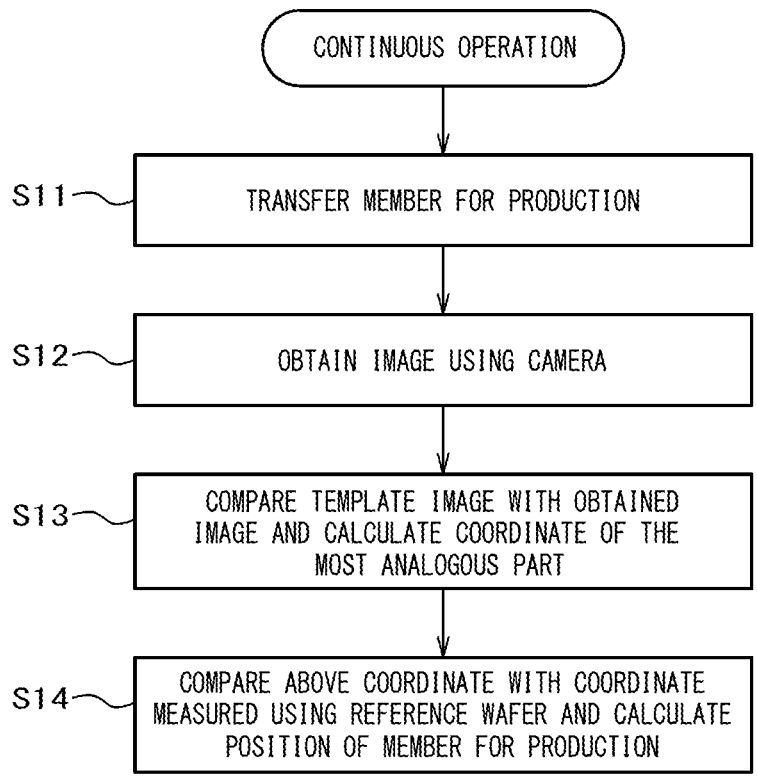
FIG. 9 is a flowchart used for explaining a continuous operation.

A method for die positioning will be explained with reference to FIG. 6 to FIG. 9. FIG. 6 is a flowchart used for explaining a teaching. FIG. 7 is a diagram showing examples of unique portions (selection areas). FIG. 8 is a diagram showing examples of registered images and analogous images. FIG. 9 is a flowchart used for explaining a continuous operation.

An algorithm for die positioning uses pattern matching using two or more template models (a search algorithm using template matching), and executes a calculation using a generally-known normalized correlation equation. It will be assumed that the calculation result is defined as a concordance rate. The template matching includes template matching is used for a teaching of reference learning and a continuous operation during production.

First, the teaching will be explained with reference to FIG. 6. The teaching is an operation executed in advance before the continuous operation in the die bonding process shown in FIG. 5.
(Step S1)

The control section 8 transfers a reference wafer to the relevant pickup position as is the case with Process 2.
(Step S2)

The control section 8 photographs the reference wafer using the wafer recognition camera 24 and obtains the image of the reference wafer.
(Step S3)

Although details will be described later, the control section 8 performs the rough positioning of a die using the dicing grooves of the reference wafer, that is to say, the contour of the die on the basis of the image obtained at Step S2. Then, the control section 8 moves the detected position of the die to the relevant pickup point, that is to say, to the center of the visual field (center of the optical axis) of the wafer recognition camera 24.
(Step S4)

The control section 8 again photographs the reference wafer using the wafer recognition camera 24, and obtains an image PCr shown in FIG. 7.
(Step S5)

The control section 8 selects a unique portion UA as shown in FIG. 7 in the image PCr as a template model in the after-mentioned way.
(Step S6)

The control section 8 stores a positional relationship (coordinate) between the selected unique portion (selection area) UA and the reference wafer in the storage device 82.
(Step S7)

The control section 8 stores the image of the selection area (template image) PT, a work image that plays a role of reference and the coordinate of the work image in the storage device 82.

Next, a continuous operation at the die bonding process shown in FIG. 5 will be explained with reference to FIG. 9.
(Step S11)

The control section 8 transfers a product wafer as a member for the production to the relevant pickup position as explained at Process P2 shown in FIG. 5. In the die position inspection at the intermediate stage 31, as explained at Process 10 shown in FIG. 5, a die D as a member for the production is mounted on the intermediate stage 31. In the inspection of the relative position of the die with respect to the substrate, as explained at the process P13 shown in FIG. 5, the die D as the member for the production is bonded to the substrate S.

The die positioning at Process P3, the die position inspection at Process P11, and the inspection of relative position of die with respect to substrate at Process P14 shown in FIG. 5 are executed at Step S12 to Step S14 as described below.
(Step S12)

At Process P3, the control section 8 photographs the product wafer using the wafer recognition camera 24, and obtains an image PCn shown in FIG. 8. At Process P11, the control section 8 photographs the die D on the intermediate stage 31 using the stage recognition camera 32, and obtains the image PCn shown in FIG. 8. At Process P14, the control section 8 photographs the die D on the substrate S using the substrate recognition camera 44, and obtains the image PCn shown in FIG. 8.
(Step S13)

As shown in FIG. 8, the control section 8 compares the template image PT stored in the teaching with the obtained image PCn of the product die, and calculates the coordinate of an image PTn that is a part of the image PCn and the most analogous to the template image PT.
(Step S14)

The control section 8 compares the coordinate of the image PTn with the coordinate measured using the reference wafer, and calculates the position of the product die (an offset between the image PTn and the template image PT).

Here, the rough positioning of the die can be performed between Step S11 and Step S12 as is the case with Step S2 and Step S3 performed in the teaching.

Figure 10:
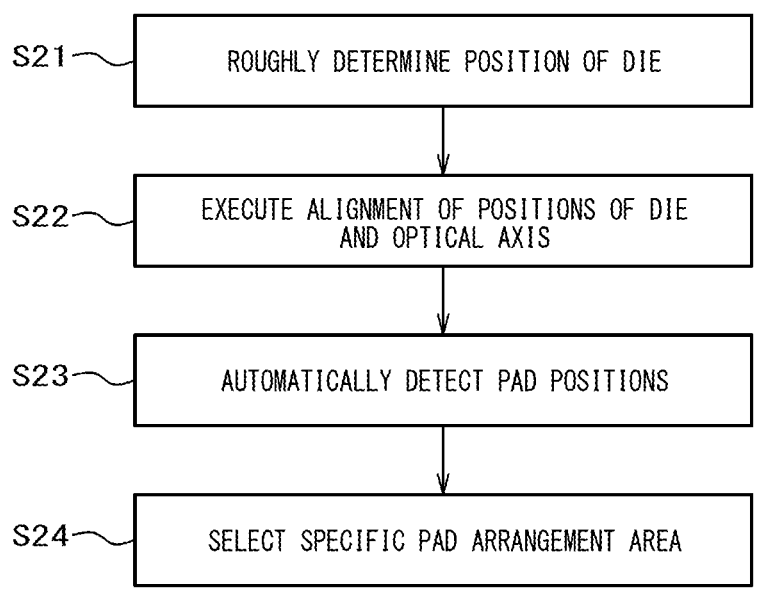
FIG. 10 is a flowchart used for explaining the automatic registration sequence of a template model.
Figure 11:
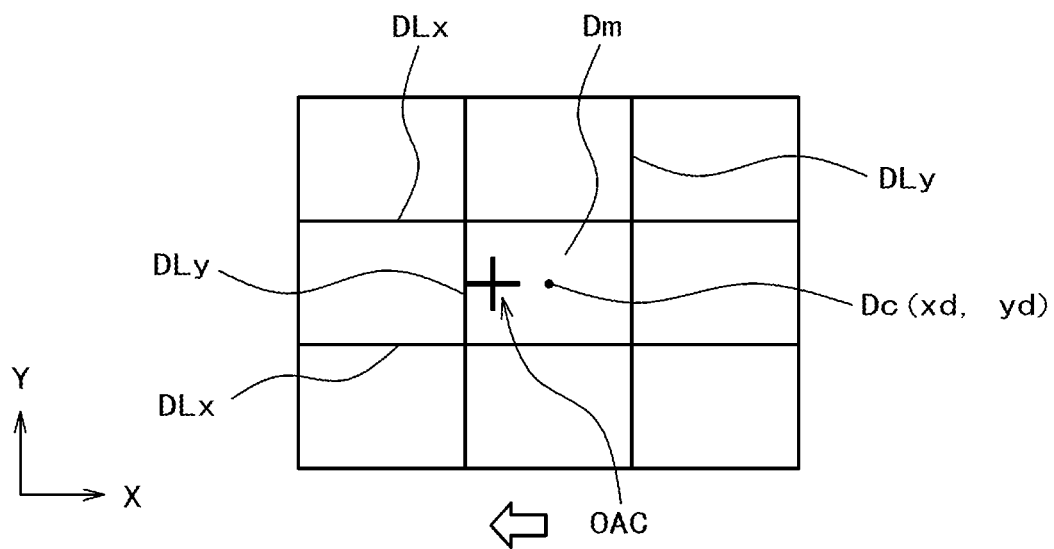
FIG. 11 is a diagram showing a rough positioning method using dicing grooves at Step S3 shown in FIG. 6.

Next, the automatic registration sequence of a template model shown in Step S2 to Step S5 in FIG. 6 will be explained with reference to FIG. 10 and FIG. 11. FIG. 10 is a flowchart used for explaining the automatic registration sequence of a template model. FIG. 11 is a diagram showing a rough positioning method using dicing grooves (dicing lines).

The present embodiment is described on the premise that the degrees of accuracies of dicing grooves (the degrees of accuracies of the positions of dice obtained using the degrees of accuracies of the dicing grooves) are lower than the degrees of accuracies of pad pitches. The fundamental principle of the present embodiment includes the following steps of: (A) roughly determining the position of a die by detecting the dicing grooves (Step S21); (B) executing the alignment of the positions of the die and the optical axis on the basis of the position determined by rough positioning (Step S22); (C) automatically detecting the positions of pads on the basis of the position determined by rough positioning (Step S23); and (D) automatically detecting a specific pad arrangement on the basis of the detected positions of the pads, and registering a specific pad arrangement area as a unique portion (selection area) (Step S24).
(Step S21: Rough Positioning of Die)

The control section 8 photographs the wafer using the wafer recognition camera 24 (Step S2) and detects the dicing grooves of the wafer, that is to say, the contour of the die. The control section 8 performs the rough positioning of the die using the detected dicing grooves (Step 3).

As shown in FIG. 11, the control section 8 detects dicing grooves DLx and dicing grooves DLy that surround a target die Dm from the photographed data obtained using the wafer recognition camera 24, and roughly determines the center position Dc of the die Dm. Here, it will be assumed that the coordinate of the center position Dc is (xd, yd).

(Step S22: Alignment of Positions of Die and Optical Axis)

The control section 8 moves the die Dm to the relevant pickup point, that is to say, to the center of the visual field (center of the optical axis) on the basis of the position of the die detected at Step S21 (Step S3). For example, as shown in FIG. 11, if there is a misalignment between the center position Dc of the die Dm and the center of the optical axis OAC that is shown by a cross, the control section 8 moves the die Dm in a direction shown by an arrow so that the center position Dc of the die Dm coincides with the center of the optical axis OAC.

(Step S23: Automatic Detection of Positions of Pads)

The control section 8 photographs the die using the wafer recognition camera 24, and detects the positions of pads provided to the die using the photographed image. The positions of the pads are detected in consideration of, for example, the areas, aspect ratios, and shapes of blobs, the relative positions of the pads with respect to a verge of the die, the dispositions of spaces between the pads, and the like.

In order for any of other areas to be prevented from erroneously detected as the area of the template model, the area of the template model needs to have a more unique pattern than the patterns of the other areas. Since pad portions formed on the surface of a die D can be patterns having the highest possible positional accuracies, the present embodiment automatically detects pads and registers the pads as models. Here, the photographing of the entirety of a die is indispensable for a die surface inspection, and it is difficult to simply judges whether pads are square or not from the images of the pads photographed with a magnification used in this case. Furthermore, since similar dice are disposed on a wafer, even if it is tried to select a part having a unique pattern in one die, there is a possibility that an erroneous selection is executed because similar patterns are present in neighboring dice.

Figure 12A:
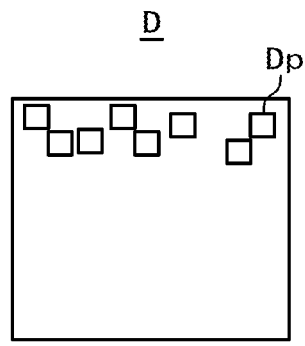
FIG. 12A is a diagram showing pads randomly disposed.
Figure 12B:
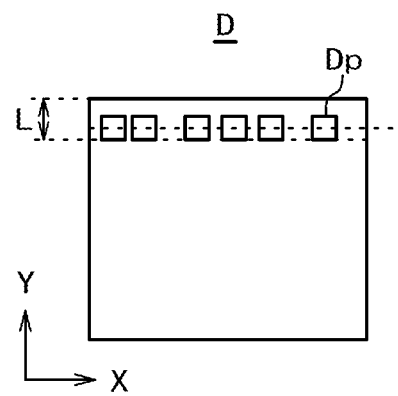
FIG. 12B is a diagram showing pads alignedly disposed.
Figure 12C:
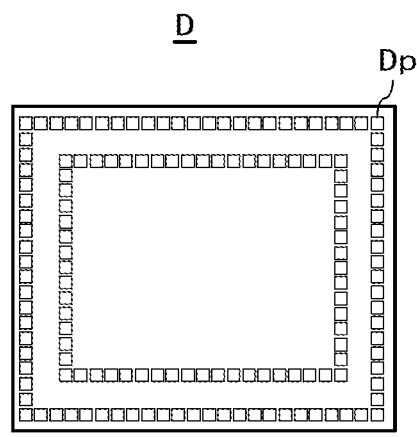
FIG. 12C is a diagram showing pads disposed on the four sides.
Figure 12D:
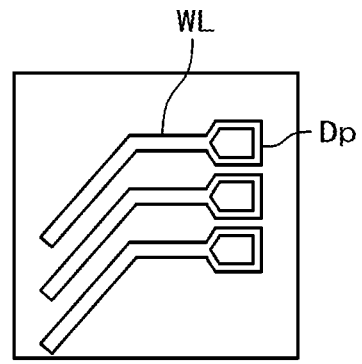
FIG. 12D is a diagram showing an image of pads and wirings connected to the pads.

An automatic detection method of the positions of pads will be explained with reference to FIG. 12A to FIG. 12D. FIG. 12A is a diagram showing pads randomly disposed. FIG. 12B is a diagram showing pads alignedly disposed. FIG. 12C is a diagram showing pads disposed on the four sides. FIG. 12D is a diagram showing an image of pads and wirings connected to the pads.

(C-1) Template Matching

The typical shape of a pad is created as a model image, and template matching is performed using the model image, and the positions of the pads are judged using the score of the template matching and the coordinate of the model image.

(C-1-1)

To cite one example, plural images of pads are collected for each of various types of wafers by photographing each of the various types of the wafers using the wafer recognition camera 24. These pad images are averaged and synthesized to obtain average pad images. In the case where there are small variations among wafers of one type, a method of using these average images is advantageous. Synthesizing an average image of a pad for each of the various types of wafers is executed using real images in order to take the influence of a probe trace into consideration. Here, the probe trace is a trace formed by a probe needle coming into contact with a pad in a wafer test for checking whether a device function is accurately realized or not on a wafer in the final stage of the preprocess of a device manufacturing process. The average image of a pad for each of the various types of wafers is registered as a template model, and pads are detected using the template model. Judgment of whether a position of an image is a pad or not is executed by setting a threshold to the score, or the like. If there is a position larger than the threshold, the position is defined as a pad candidate position, and the coordinate of the position is obtained.

(Judgment after Candidate Position Detection)

The shape of a die D is quadrangular in plane view, and pads Dp are disposed in the periphery of the die D except for a center pad type product around the center of dice of which pads are disposed. In addition, the pads Dp are disposed in the vicinity of at least one side of the four sides forming the quadrangle of the die D.

Pads Dp are never disposed randomly as shown in FIG. 12A. In most cases, as shown in FIG. 12B, pads Dp are disposed in a line or two lines along the counter of a die although pitches between the pads Dp are different. In FIG. 12B, the pads Dp are disposed in the upper part of FIG. 12B along an upper one of two sides, which extend in the X axis direction, of the contour of the die D.

Subsequently, among groups of pad candidate positions, a group the pad candidate positions of which have no misalignments vertically (in the Y axis direction) or horizontally (in the X axis direction) are selected with reference to the obtained coordinates. In addition, pad candidate positions are selected in such a way that the pad candidate positions are within a predefined range from the edge of the die D. For example, if the size of the die is small, say, 1 to 5 mm, a row of candidate positions that exist within an area from 10% to 20% of the size of the die away from the edge of the die D are set to pad positions. If the size of the die is larger than 5 mm, a row or two rows of candidate positions that exist within an area from the edge of the die to a predefined distance (L) away from the edge of the die D are set to pad positions. In this case, L is, for example, 100 to 400 Here, in the present embodiment, as shown in FIG. 12C, it will be assumed that pads Dp are disposed in up to two lines along each of the four sides of the die D.

(C-1-2)

To cite another example, plural images of pads are photographed for each of various types of wafers using the wafer recognition camera 24, and plural representative pad are registered as models for each of the various types of wafers in advance. Search is executed on images, which is obtained by photographing a die used for obtaining a template therefrom using the wafer recognition camera 24, with the use of the respective model, and a die having a large number of candidates is used. In the case where there are large variations among wafers of one type, a method of using these models is advantageous. A real image is made representative in order to take the influence of a probe trace into consideration. A pad candidate position having a large number of candidates is used, and the coordinate of the pad candidate position is obtained. Judgment after the detection of the candidate positions is the same processing as described in (C-1-1).

(C-2) Binarization

Binarization processing that converts data into 0 and 1 with reference to an arbitrary threshold is performed on a grey image, and a pad position is judged on the basis of the area, aspect ratio, and coordinate of a blob that emerges in the blob analysis. Binarization is performed using the discrimination analysis method within the range of a positional condition for pad candidates (within the edge area of a die) described in (Judgment after Candidate Position Detection) in (C-1-1). Here, the discrimination analysis method is a method in which, in the case where pixels belonging to a blackish pixel class (the concentration value of which is near to 0) and pixels belonging to a whitish pixel class (the concentration value of which is near to the maximum value) are distributed left and right with respect to a certain threshold, a specific threshold is determined so that the degree of separation between the former pixels and the latter pixels becomes larger. If no candidate position is detected, a threshold is incremented or decremented by about 10% of the average luminance of the measurement area and the detection of a candidate position is repeated until a candidate position is found. It will be assumed that the size of a pad is 20 to 150 μm, and tilted pads are not treated. It will be assumed that the aspect ratio is 1:1 to 1:2. In the case of the aspect ratio is 1:2, the length of a side of the pad in a direction along a direction in which the edge of a neighboring die extends corresponds to 1 and the length of another side of the pad in a direction that intersects with a direction in which the edge of a neighboring die extends corresponds to 2.

As shown in FIG. 12D, there is a case where a wiring WL connected to a pad Dp is photographed, so that, a detection process is incorporated as a retry or the like after the wiring WL is eliminated using methods such as the opening (processing that, after contraction that contracts an image by the amount of one pixel is performed N times, expansion that expands the image by the amount of one pixel N times), closing, dilation, and erosion of morphology. Whether the detected candidate position meets the condition shown by the judgment after the candidate position detection in (C-1-1) is checked, and it is determined whether or not the detected candidate position is considered to correspond to a pad.

(C-3) Machine Learning

Judgment is executed using machine leaning. The relevant machine is made to learn how to distinguish the images of pads from the images of areas that are not pads, and the machine is made to detect the positions of pads.

(Step 24: Selection of Specific Pad Arrangement Area)

Since specific pads have the same size, each of them does not have a unique shape. Therefore, in the present embodiment, a specific pad arrangement is used by utilizing the dispositions of plural pads. The control section 8 selects a specific pad arrangement area in consideration of spaces between pads, and register the specific pad arrangement area as a template.

Figure 13A:
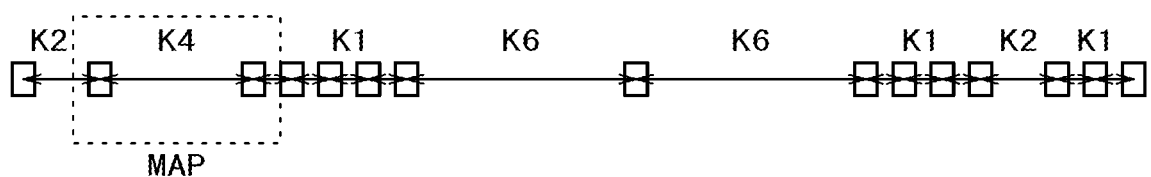
FIG. 13A is a diagram showing a pad disposition example having a unique inter-pad distance.
Figure 13B:
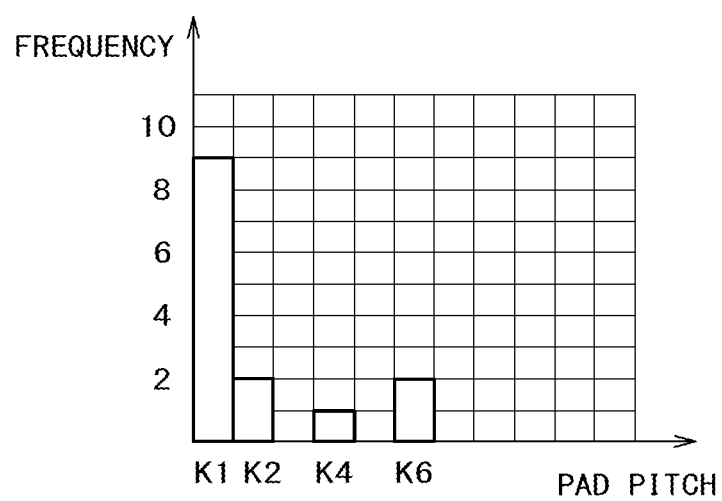
FIG. 13B is a histogram of inter-pad distances in the pad disposition shown in FIG. 13A.
Figure 14A:
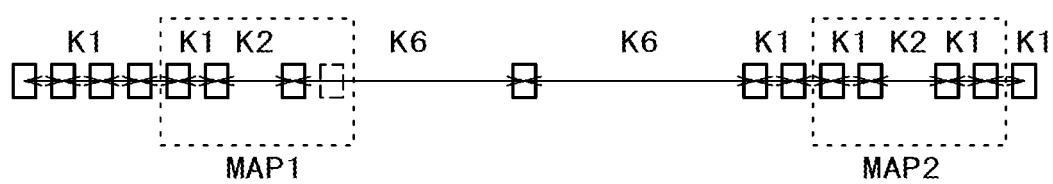
FIG. 14A is a diagram showing a pad disposition example having no unique inter-pad distance.
Figure 14B:
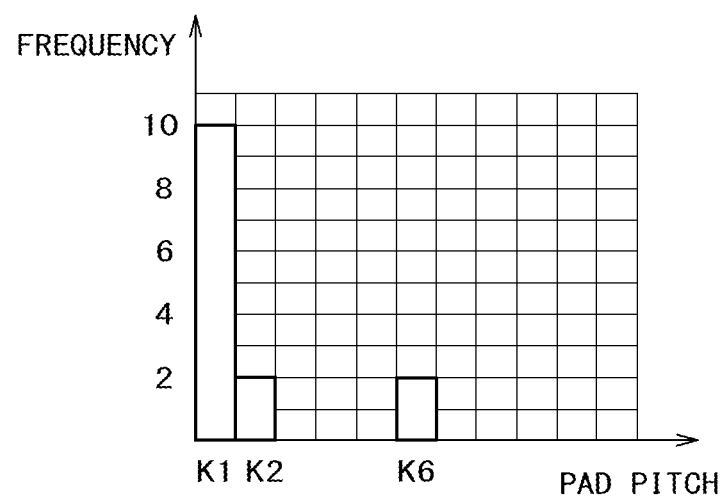
FIG. 14B is a histogram of inter-pad distances in the pad disposition shown in FIG. 14A.

A method for finding a specific pad arrangement will be explained with reference to FIG. 13A, FIG. 13B, FIG. 14A, and FIG. 14B. FIG. 13A is a diagram showing a pad disposition example having a unique inter-pad distance, and FIG. 13B is a histogram of inter-pad distances in the pad disposition shown in FIG. 13A. FIG. 14A is a diagram showing a pad disposition example having no unique inter-pad distance, and FIG. 14B is a histogram of inter-pad distances in the pad disposition shown in FIG. 14A.

A list of pad candidate positions at each of which pads are disposed in a straight line is used. For example, if pads are disposed in a straight line in the X direction, inter-pad distances in the X direction are listed as data, and a histogram of the inter-pad distances is created.

In the pad arrangement shown in FIG. 13A, as shown in FIG. 13B, the frequency of a pad pitch K1 having the smallest inter-pad distance is 9; the frequency of a pad pitch K2 having the next smallest inter-pad distance is 2; the frequency of a pad pitch K4 having the next smallest inter-pad distance after the pad pitches K2 is 1; and the frequency of a pad pitch K6 having the next smallest inter-pad distance after the pad pitch K4 is 2.

An area including an inter-pad distance the frequency of which is 1 and a pair of pads forming the inter-pad distance in the histogram can be fundamentally considered to be a unique area. Therefore, an area including the pad pitch K4 and a pair of pads forming the pad pitch K4 is set to a model area candidate position MAP.

In the pad arrangement shown in FIG. 14A, as shown in FIG. 14B, the frequency of a pad pitch K1 having the smallest inter-pad distance is 10; the frequency of a pad pitch K2 having the next smallest inter-pad distance is 2; and the frequency of a pad pitch K6 having the next smallest inter-pad distance after the pad pitches K2 is 2.

In the pad arrangement shown in FIG. 14A, there is no area the frequency of which is 1. In the case where there is no area the frequency of which is 1, candidate positions are sequentially defined by selecting areas in ascending order of their frequencies, and an area including a first selected area plus an area including a neighboring pad or an area including the minimum pad pitch is set to be a candidate position. Furthermore, whether there is a pattern similar to the area as the candidate position within the relevant search area is always checked, and if there is no similar pattern, the area as the candidate position is set to be a model area. In other word, an inter-pad distance the frequency of which is the minimum is searched for, and a pair of pads forming the inter-pad distance are candidates for specific pad arrangement having a unique pitch. Then, after checking whether there is a pair of pads forming an inter-pad distance the frequency of which is the same or not in a relevant search area, the candidate specific pad arrangement is registered as a template model if there is not. If there are two or more types of areas the frequency of which is the minimum, an area having the shortest inter-pad distance will be given priority. In other word, if there are two or more pairs of pads each of which forms the inter-pad distance the frequency of which is the minimum, preferentially defines a pair of pads forming a smaller inter-pad distance as a specific pad arrangement having a unique pitch. Therefore, an area including two pads the inter-pad distance of which is a pad pitch K2, a neighboring pad, and the minimum pitch K1 is set to be a model area candidate position MAP1. In addition, an area including two pads the inter-pad distance of which is a pad pitch K2, and neighboring pads is set to be a model area candidate position MAP2.

<Modification>

Hereinafter, some of the representative modifications of the embodiment will be illustrated. It will be assumed that, in the descriptions of the following modification, components having the same configurations and functions as those of the above-described embodiment can be given the same reference signs. Furthermore, it will also be assumed that, in the descriptions of these components, descriptions made in the above embodiment are quoted accordingly within a technically consistent range. In addition, a part of the above embodiment and entireties or parts of plural modifications can be used for both above embodiment and plural modifications accordingly and in a combined manner within a technically consistent range.

(First Modification)

Figure 15:
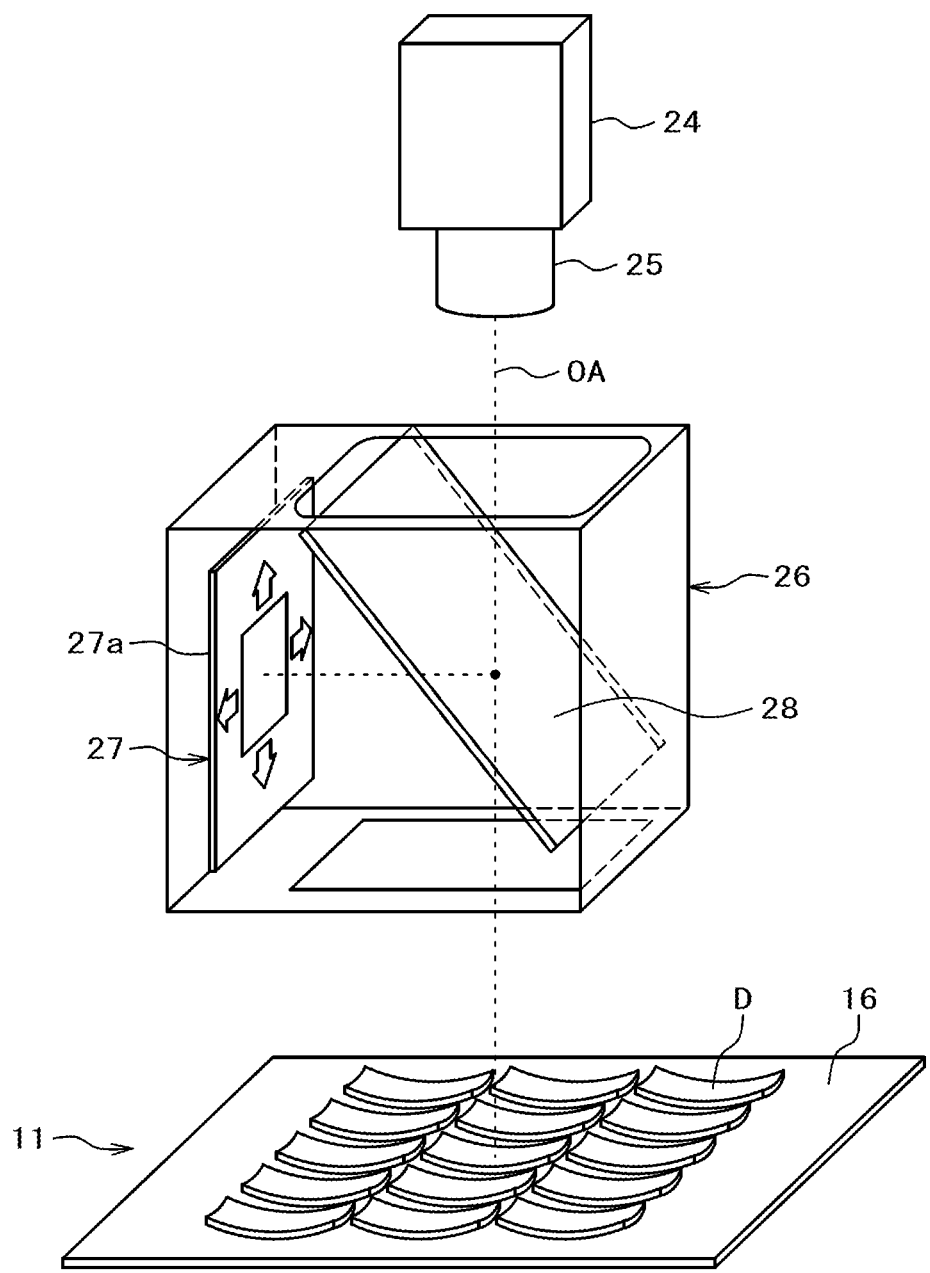
FIG. 15 is a diagram showing a wafer recognition camera, a coaxial illustration, and a wafer in a first modification.

A dicing tape 16 is pressed on a support ring 17 so that the dicing tape 16 does not sag down in a pickup process, with the result a tension is applied to the dicing tape 16 and the dicing tape 16 is held flat. This process is called an expanding process. In the case of the thickness of a wafer 11 on which the expanding process is executed being 200 μm or larger and smaller than 300 dice D warp due to the expanding tension. In the case of the thickness of a wafer 11 used around 2011 about 100 μm in thickness, dicing grooves can be detected, for example, by adjusting illumination intensity. However, in the case of the thickness of an ultrathin wafer, which is used recently, being several tens μm, for example, 20 μm, dice warp even if the expanding process is not executed, so that the warpages of the dice get much worse when the expanding process is executed on the dice as shown in FIG. 15. Therefore, no matter how much the illumination intensity of an existing illumination system is adjusted, a luminance difference between the luminance of the dicing grooves and that of the peripheries of the dice is not so large, so that the dicing grooves, that is to say, the contours of the dice become bleary in some cases. As a result, it becomes difficult to detect the dicing grooves, and the rough positioning of the dice becomes difficult.

Figure 16:
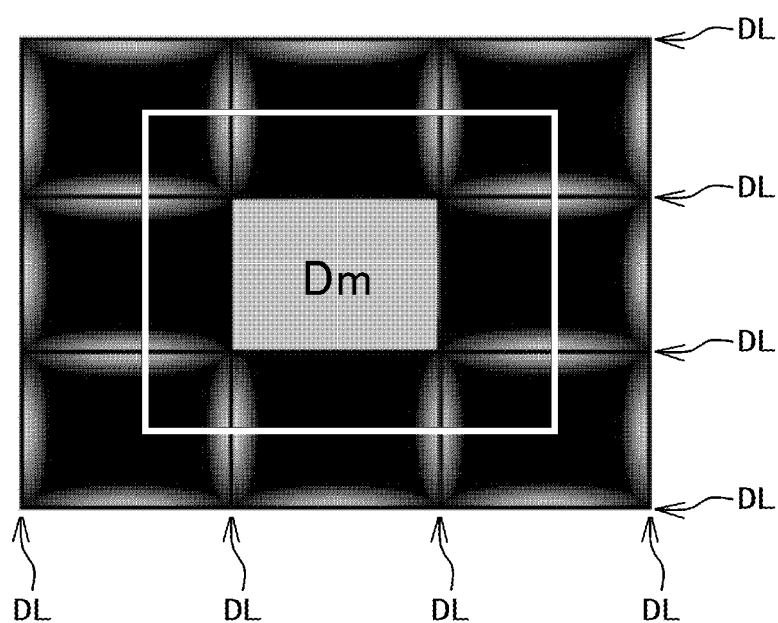
FIG. 16 is a diagram showing an image of a wafer photographed by an optical system shown in FIG. 15.
Figure 17:
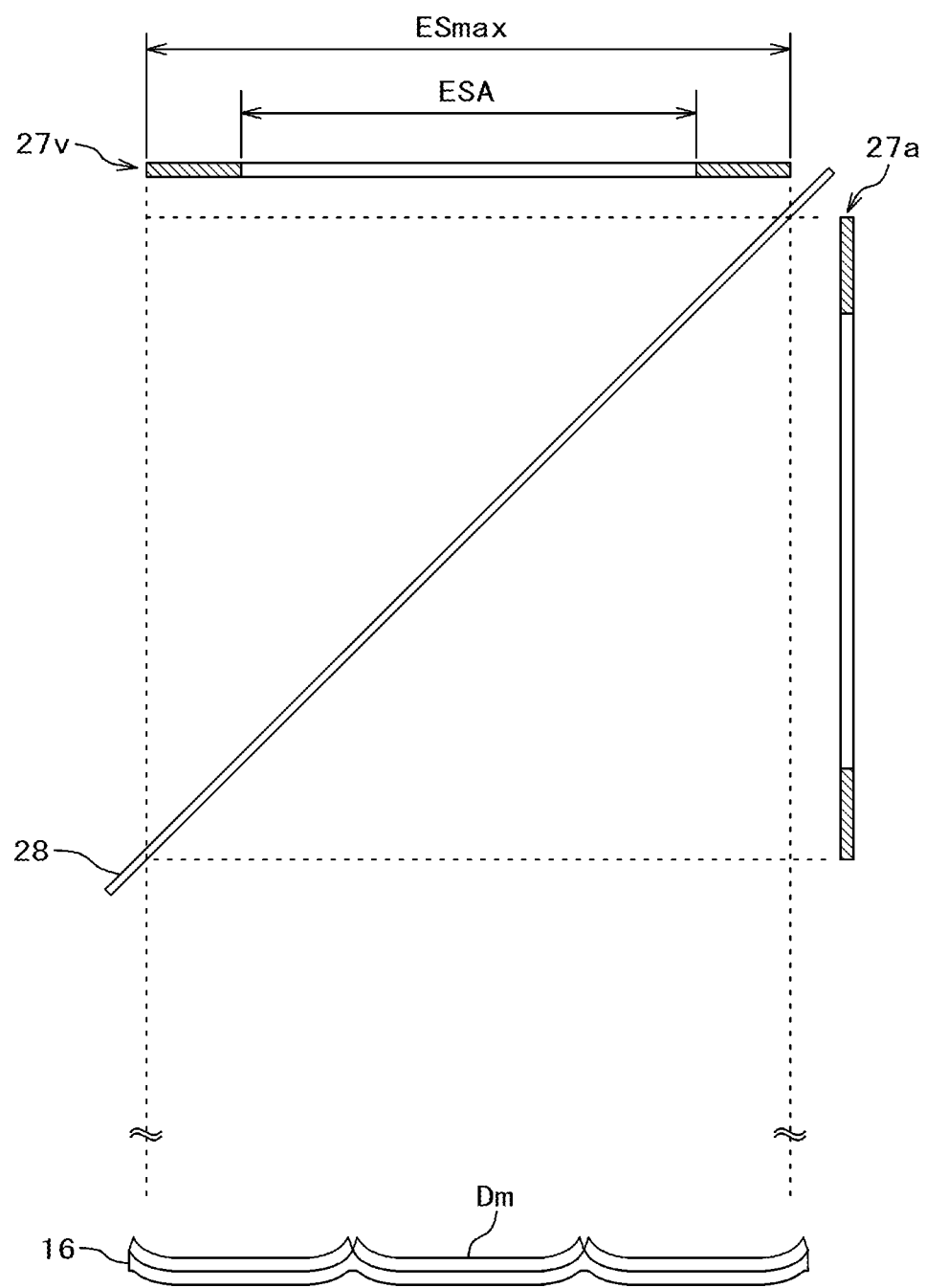
FIG. 17 is a diagram showing an irradiation light of the coaxial illustration and a reflection light caused by the wafer.
Figure 18:
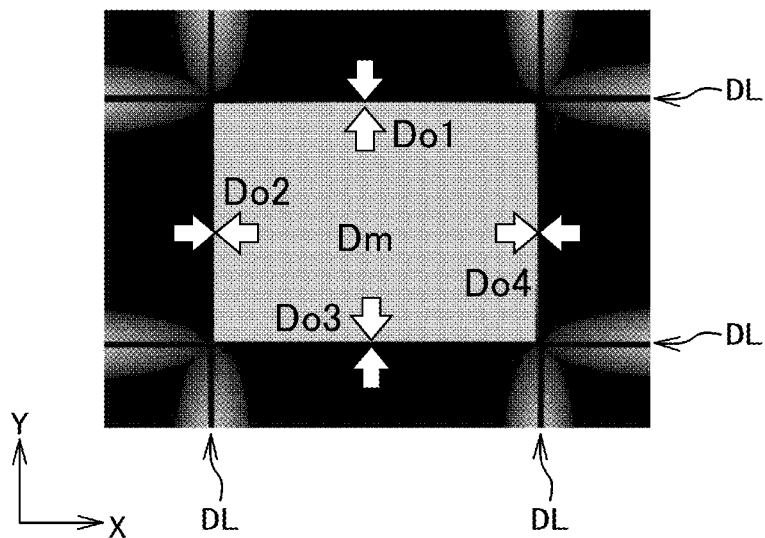
FIG. 18 is a diagram showing a photographed image in which the contour of a die is clear.
Figure 19:
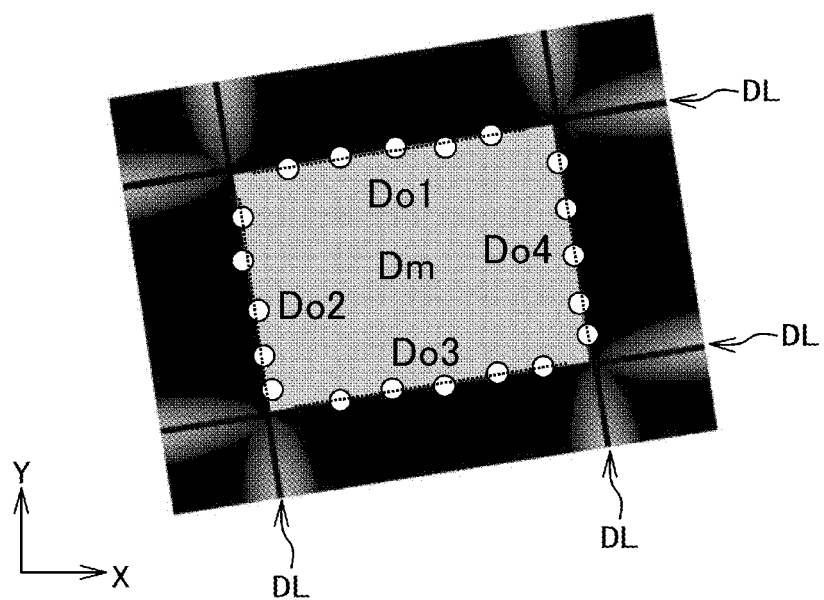
FIG. 19 is a diagram showing a photographed image in which a die rotated in XY plane.

A method for detecting the grooves of a die having a warpage will be explained with reference to FIG. 15 to FIG. 19. FIG. 15 is a diagram showing a wafer recognition camera, a coaxial illumination and a wafer used in the first modification. FIG. 16 is the photographed image of a wafer. FIG. 17 is a diagram an irradiation light of the coaxial illumination and a reflection light reflected by the wafer. FIG. 18 is a diagram showing a photographed image of a die the contour of which is clear. FIG. 19 is a diagram showing a photographed image of a die rotated in XY plane.

First, an illumination device will be explained with reference to FIG. 15. The coaxial illumination is used as the illumination device. A lens 25 (objective lens) is fixed to a wafer recognition camera 24, and the wafer recognition camera 24 is configured to photograph the image of the main surface of a die D through the lens 25. A coaxial illumination 26 having a light emission section 27 and a half mirror (semi-transparent mirror) 28 inside is disposed between the lens 25 and the die D. An irradiation light from the plane emission light source 27a of the light emission section 27 is reflected by the half mirror 28 in the same direction as the direction of an optical axis OA of the wafer recognition camera 24, and the reflected irradiation light is irradiated to a wafer 11. The scattered light irradiated to the wafer 11 in the same direction as the direction of the optical axis of the wafer recognition camera 24 is reflected by the wafer 11, and a regular reflection light of the light reflected by the wafer 11 passes through the half mirror 28 and reaches the wafer recognition camera 24 to form the image of the wafer 11.

As for dice D arranged in a grid in the wafer 11, in the case where the optical axis of the coaxial illumination 26 and the optical axis of the lens 25 almost coincide with the optical axis OA of the wafer recognition camera 24, a die Dm just below the optical axes OA becomes brighter than neighboring dice as shown in FIG. 16. This is because each of dice having warpages has the property of a concave mirror, and the reflection direction of the illumination light irradiated to the die Dm just below the optical axis OA is largely different from the reflection directions of illumination lights irradiated to the neighboring dice, so that reflection lights reflected by the warped portions of the neighboring dice do not reach the wafer recognition camera 24 except for reflection light reflected by the die Dm.

In order to make the contour shape of a die emerge in this way, the irradiation range of the illumination light irradiated to the die Dm needs to be adjusted. AS shown in FIG. 15, the wafer recognition camera 24 is located just above the die Dm that is a photographic subject, and the plane emission light source 27a of the coaxial illumination 26 is located horizontally far from the optical axis OA. However, as shown in FIG. 17, a plane emission light source 27v is located apparently just above a photographic subject due to the half mirror 28 as viewed from the photographic subject.

In the case of a die having no warpage, the maximum light emission plane size (ESmax) of the illumination is set to be about double the maximum die size (DSmax). The light emission plane size is adjusted according to the die size, and the adjusted light emission plane size (ESA) is set to be double the die size.

On the other hand, in the case of the die having a warpage, the light emission plane size is adjusted according to the extent of the warpage and the die size, and the adjusted light emission plane size (ESA) is set to be about one to three times the die size. Therefore, the maximum light emission plane size (ESmax) of the illumination is set to be larger accordingly.

As shown in FIG. 18, when the contour shape of the die Dm can be made to emerge, it becomes possible to calculate the coordinates of the four sides Do1, Do2, Do3, and Do4 of the periphery of the die Dm by using various kinds of edge detection processing as typified by secondary differential processing. Here, an edge in image processing means a boundary point between a target substance and the background, and a series of boundary points forms the contour of a target substance. Concentration values continuously changes from bright to dark or vice versa across the contour of the target substance. The secondary differential processing is a method in which an edge is defined as a position where the second derivative of the change of the concentration crosses zero.

For example, a first detection line that extends along the Y axis direction is set for the side Do1, and a position where an edge of the side Do1 exists on the first detection line is detected. The Y coordinate of the edge obtained using the first detection line is set to be the position of the side Do1. A second detection line that extends along the X axis direction is set for the side Do2, and a position where an edge of the side Do2 exists on the second detection line is detected. The X coordinate of the edge obtained using the second detection line is set to be the position of the side Do2. A position where an edge of the side Do3 exists on the first detection line is detected. The Y coordinate of the edge obtained using the first detection line is set to be the position of the side Do3. A position where an edge of the side Do4 exists on the second detection line is detected. The X coordinate of the edge obtained using the second detection line is set to be the position of the side Do4.

As shown in FIG. 19, in the case where not only one inspection point is detected on each of the sides Do1, Do2, Do3, and DO4 of the periphery but plural inspection points are detected on each of the sides Do1, Do2, Do3, and DO4, even if the die Dm is rotated in XY plane, the positions and directions of the sides Do1, Do2, Do3, and DO4 can be calculated using a least-square method or an averaging method. If the four sides Do1 to Do4 of the die Dm can be calculated, an inter section point of the lines that pass through the centers of the four sides can be set to the center of the die Dm, for example, and the central coordinate of the die Dm can be calculated.

In order to obtain the contour of the die that is located in the center of the optical axis OA by the edge detection, as shown in FIG. 17, the size of an irradiation area IA is set in accordance with the size of a die using a shading area SA. The irradiation area IA is set so that a light, which is reflected by the warpage of the exterior of a die located on the outermost side of the wafer 11 shown in FIG. 15, does not enter the wafer recognition camera 24. For example, in the FIG. 16, the outside of a quadrangle surrounded by four while line segments is set to be a shading area SA. In a general-purpose die bonder, since dice having various sizes are used in many cases, so that the general-purpose die bonder has a mechanism using which an irradiation area (a light emission area LA or a shading area SA) can be adjusted so as to be one of concentric circles (or concentric quadrangles) with respect to the optical axis OA.

Figure 20A:
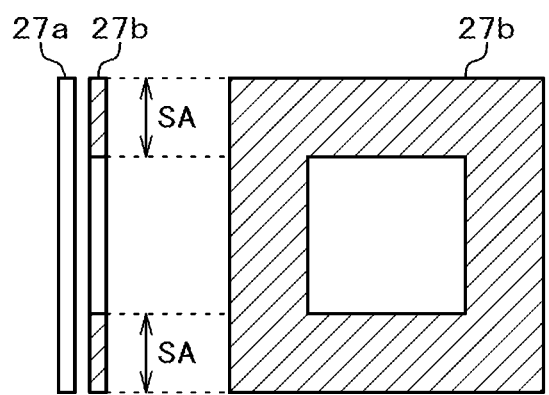
FIG. 20A is a diagram showing a case of the irradiation area being adjusted using a shading plate.

The adjustment mechanism of the irradiation area of the coaxial illumination shown in FIG. 15 will be explained with reference to FIG. 20A to FIG. 20C. FIG. 20A is a diagram showing a case of the irradiation area being adjusted using a shading plate, FIG. 20B is a diagram showing a case of the irradiation area being adjusted using a plane emission light source, and FIG. 20C is a diagram showing a case of the irradiation area being adjusted using a liquid crystal panel.

As shown in FIG. 20A, a shading plate 27b the size of which is suitable for the size of each type of die is disposed in front of the plane emission light source 27a (on the side of the half mirror 28) so that the irradiation area IA corresponds to a warpage. In this case, since the amount of warpage depends on the thickness of the wafer and the type of DAF, the size of the shading plate 27b suitable for each type of die needs to be checked in advance.

Figure 20B:
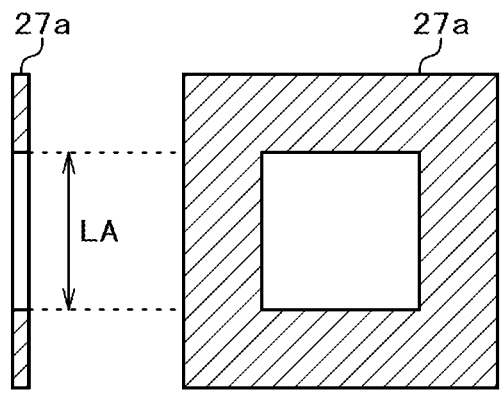
FIG. 20B is a diagram showing a case of the irradiation area being adjusted using a plane emission light source.

As shown in FIG. 20B, the plate emission light source 27a is composed of plural LEDs (Light Emitting Diodes) so that the light emission area LA can be variable, the LEDs are disposed in the shape of concentric circles or concentric quadrangles, and the lighting of the LEDs are controlled in accordance with a distance from the center.

Figure 20C:
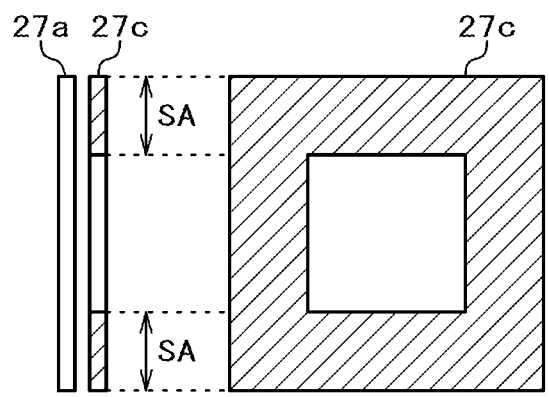
FIG. 20C is a diagram showing a case of the irradiation area being adjusted using a liquid crystal panel.

As shown in FIG. 20C, the shading area SA is set flexible by disposing a liquid crystal panel 27c in front of the plane emission light source 27a. The liquid crystal panel 27c includes an unshown control section for area control.

Figure 21:
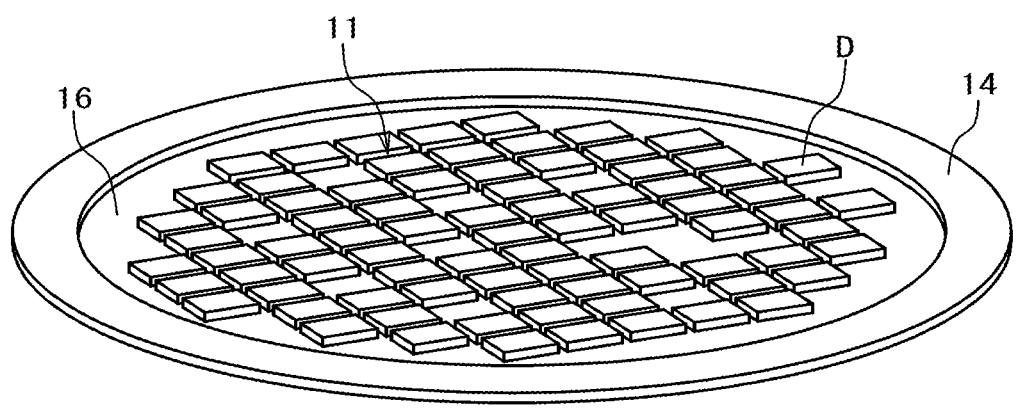
FIG. 21 is a diagram showing a toothless state of a wafer.
Figure 22:
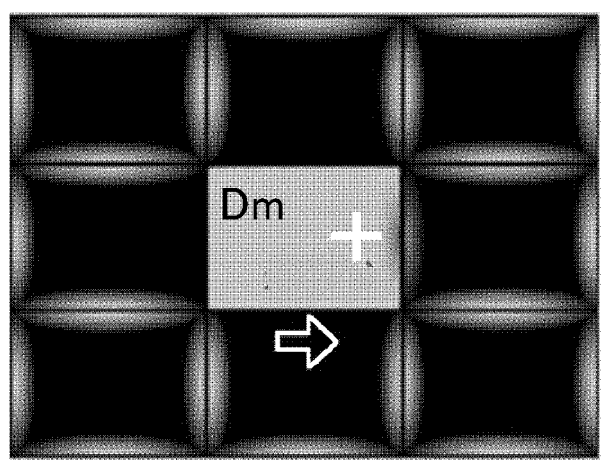
FIG. 22 shows a photographed image showing a state in which the center of a die and the center of an optical axis are misaligned from each other.

Furthermore, the above descriptions have been made on the premise that the die Dm is located just below the optical axis OA, but cases where such a premise does not hold will be described with reference to FIG. 21 and FIG. 22. FIG. 21 is a diagram showing a toothless state of a wafer. FIG. 22 shows a photographed image showing a state in which the center of a die and the center of the optical axis are misaligned from each other.

If a boundary between dice is located just below the optical axis OA, or as shown in FIG. 21, a toothless portion of a toothless wafer, which has no dice on parts of a dicing tape 16, is located just below the optical axis OA, it will be assumed that fine adjustment is automatically or manually executed so that the die Dm is located just below the optical axis OA.

In addition, as shown in FIG. 22, in the case where the center of die Dm and the center of an optical axis OAC, which is indicated by a cross, are largely misaligned, the contour of the die Dm may become unclear. In this case, after moving a clearer part of the contour of the die Dm (for example, the left side of the contour in FIG. 22) in a direction shown by an arrow in order to gradually make the clearer part approach the center of the optical axis OAC, the fine adjustment can be automatically done by performing retry processing in which contour detection is executed again or the like. Here, it is all right if first alignment of the positions of the die Dm and the optical axis OA is performed not automatically but manually.

(Second Modification)

In the case where it is possible to perform positioning the position of the die Dm with an accuracy higher than the accuracy of a pad pitch in advance by rough positioning through the detection of dicing grooves, a model including a single pad or a small number of pads can be used without taking the disposition of pads (pad arrangement) into serious consideration unlike the case of the embodiment. If the rough positioning of a die is performed at the time of runtime (at the time of continuous operation), it is not necessary that a template model is unique within the range of the rough positioning accuracy.

The fundamental principle of the second modification has been obtained on the basis of a concept that the accuracy of dicing grooves (the accuracy of the position of a die obtained by the accuracy of the dicing grooves) is generally better than the accuracy of pad pitches (K). Furthermore, the fundamental principle of the second modification is also based on a concept that, after the dicing grooves are detected and the position of a die is roughly positioned, a search area is set on the basis of the position determined by rough positioning, and the position of the die is accurately positioned through matching processing using a template defined in advance.

Figure 23:
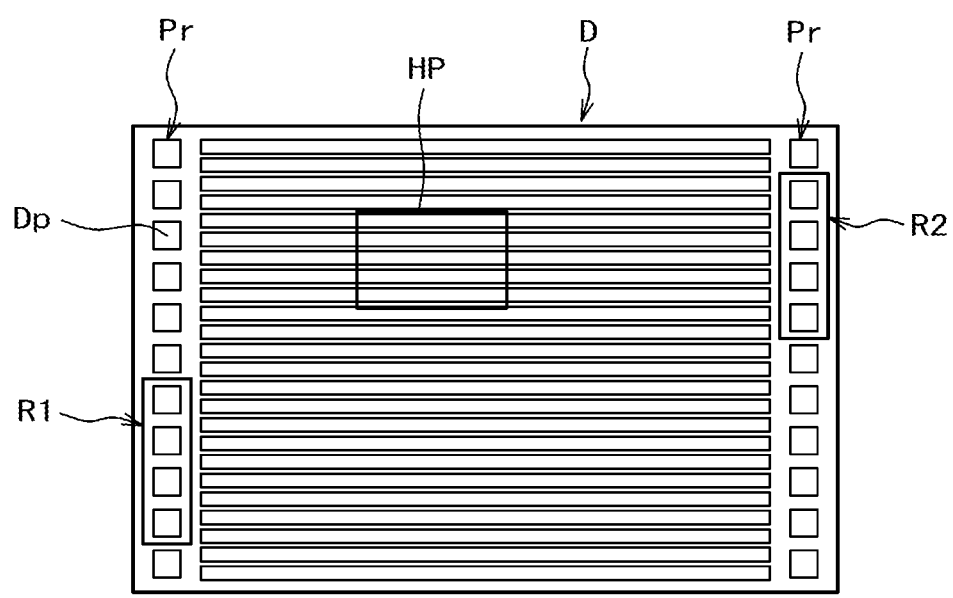
FIG. 23 is a diagram showing a die that does not have a specific pad arrangement that a second modification is targeting.

In the second modification, a die D that does not have unique portions such as a specific pad arrangement or an alignment marking as shown in FIG. 7 is made to be a target, and the position of the die D is detected using nonspecific pad arrangements Pr in which pads are arranged at constant pitches as shown in FIG. 23. Hereinafter, a detection method of the position of a die D according to the second modification will be explained with reference to FIG. 11 and FIG. 24A to FIG. 24C.

Figure 24A:
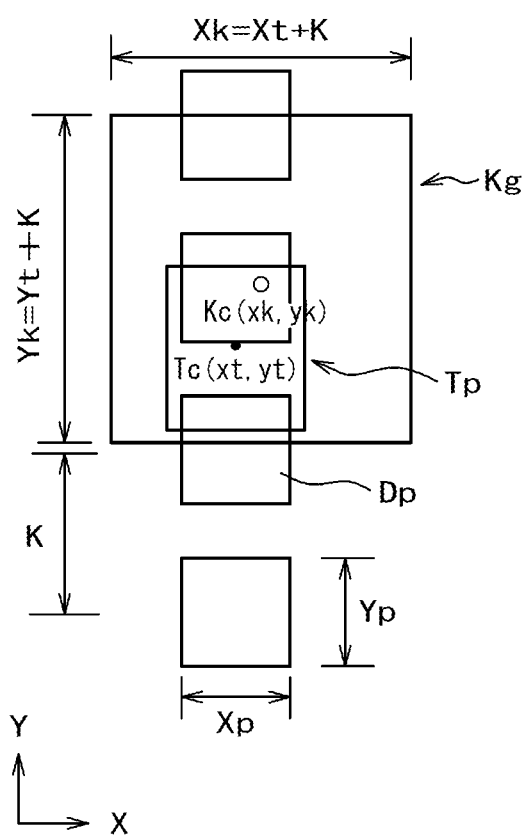
FIG. 24A is a diagram showing the size of the search area.
Figure 24B:
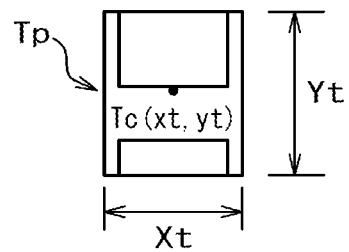
FIG. 24B is a diagram showing the size of the template.
Figure 24C:
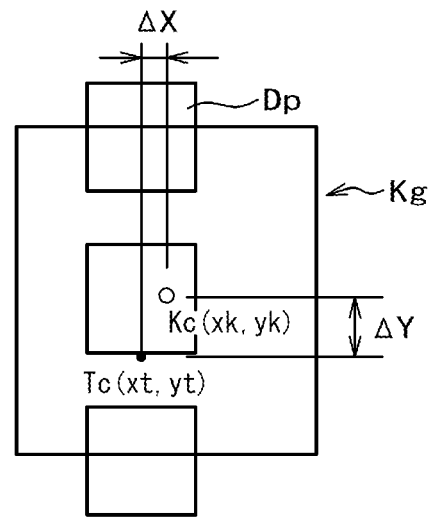
FIG. 24C is a diagram showing a positional misalignment.

FIG. 24A to FIG. 24C are diagrams used for explaining pattern matching performed in the second modification. FIG. 24A to FIG. 24C are diagrams showing a method for performing fine positioning with a predefined accuracy by performing pattern matching in a search area obtained on the basis of rough positioning performed in a position in an area R1 cut out in FIG. 23. FIG. 24A is a diagram showing the size of the search area, FIG. 24B is a diagram showing the size of the template, and FIG. 24C is a diagram showing a positional misalignment.

First, as shown in FIG. 11, as is the case with Step S2 of the teaching in the embodiment, the dicing grooves DLx and DLy that surround a target die DM are detected using the photographed data obtained from the wafer recognition camera 24, and the rough positioning of the center position Dc of the die Dm is performed. Here, it will be assumed that the coordinate of the center position Dc is (xd, yd).

Next, as shown in FIG. 24A, the size (Xk×Yk) of a search area Kg on which pattern matching is performed is set wider than the size (Xt×Yt) of a template Tp including a pad Dp shown in FIG. 24B by a pad pitch (K) in both X and Y directions at most. Herewith, the template is inevitably included in the search area Kg. It will be assumed that the length of the search area Kg in the X direction is Xk and the length of the search area Kg in the Y direction is Yk. In addition, it will be assumed that the length of the template Tp in the X direction is Xt and the length of the template Tp in the Y direction is Yt. Since the template is inevitably included in the search area Kg, the center position Tc of the template in the photographed data obtained from the wafer recognition camera 24 can be detected using template matching. Here, it will be assumed that the coordinate of the center position Tc is (xt, yt). Furthermore, although the above description states that the size of the search area Kg is set wider than the size of the template Tp by the pad pitch (K) in both X and Y directions at most, the size of the search area Kg is set wider than the size of the template Tp by a difference that is equal to the pad pitch (K) or smaller and equal to the accuracy of a dicing groove (the accuracy of the position of a die obtained from the accuracy of the dicing groove) or larger. In other words, the search area Kg is set to be an area having the lengths in the X direction and the Y direction being the lengths in the X direction and the Y direction of the template Tp plus lengths each of which is smaller than the pitch of an orderly pattern arrangement in the pad arrangement Pr and larger than the accuracy of the dicing groove (the position of the die obtained from the accuracy of the dicing groove) respectively.

As a result, as shown in FIG. 24C, a positional misalignment (AX, AY), which is a correction value, can be detected from the center position Kc of the search area Kg, that is to say, the center position Tc of the template at the time there is no positional misalignment. Here, it will be assumed that the coordinate of the central position Kc is (xk, yk).

By performing this processing at another position, if possible, at a position in an area R2 that is located diagonally to the area R1 in the die D as shown in FIG. 23, it becomes possible to calculate a rotational misalignment A.

The condition of the template for the template Tp to be inevitably included in the search area Kg is that a pattern that is the same or similar is not generated in the search area Kg. In other words, the condition is that the size of the template Tp is larger than the size of the pad Dp, and the template Tp is formed across two or more pads Dp. In FIG. 24A and FIG. 24C, the number of pads Dp across which the template Tp is formed is 3.

Figure 25:
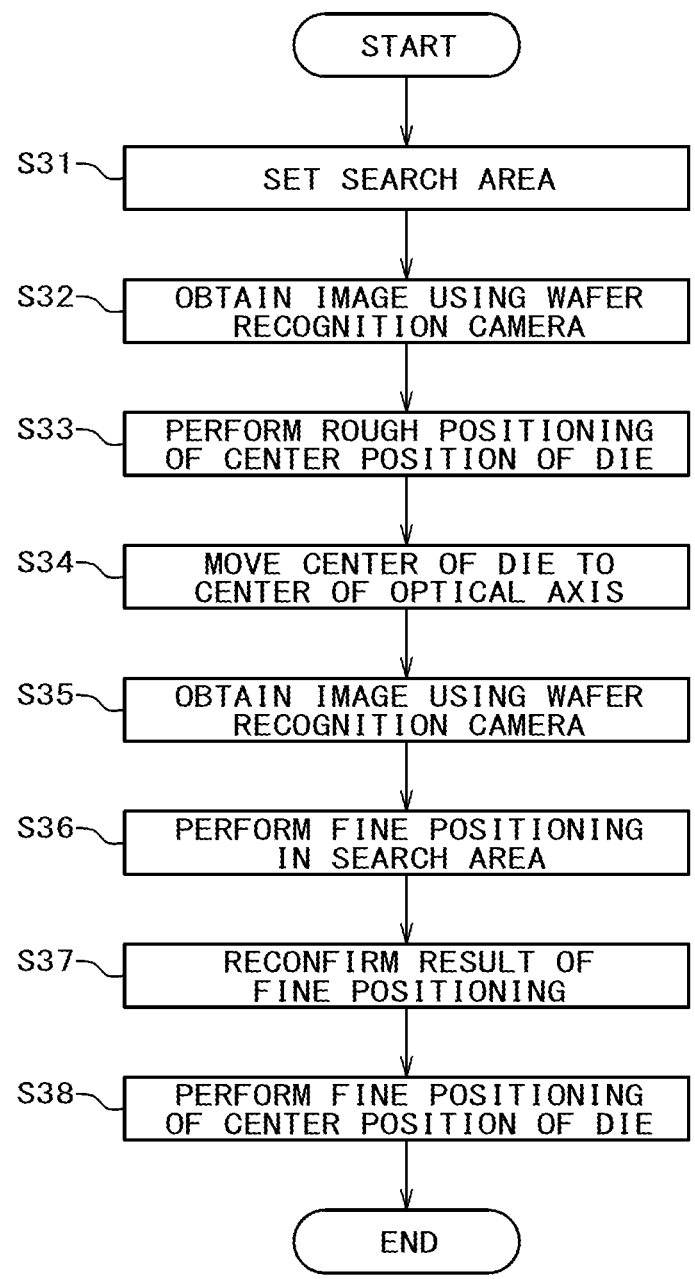
FIG. 25 is a diagram showing a bonding processing flow performed in the second modification.

Next, the flow of the fine positioning processing of the die that has been described so far in the second modification shown in FIG. 25 will be explained with reference to FIG. 24A to FIG. 24C.

First, two search areas Kg for pattern matching are set. For example, two search areas Kg shown in FIG. 24A are set in the areas R1 and R2 shown in FIG. 23 (Step S31). As shown in FIG. 11, the control section 8 photographs the dicing grooves DLx and DLy that surround a die Dm to be picked up using the wafer recognition camera 24, and obtains an image (photographed data) (Step S32). Next, the control section 8 detects the dicing grooves DLx and DLy from the photographed data obtained at Step S32, and roughly positions the center position Dc (xd, Yd) of the die (Step S33). The control section 8 moves the die Dm to the relevant pickup point, that is to say, to the center of the visual field (center of the optical axis) on the basis of the position of the die Dm detected in Step S23 (Step S34).

Next, the control section 8 photographs the target die Dm using the wafer recognition camera 24 and obtains an image (Step S35). Subsequently, the control section 8 cuts out the two search areas defined at Step S31 on the basis of the rough positioning of the center position Dc of the die obtained at Step S23, performs matching processing using the predefined template Tp shown in FIG. 24B, and performs fine positioning in the two search areas Kg (Step S36). In this case, the coordinate of a position with the highest score is set to the fine coordinate of the position determined by fine positioning.

In order to reconfirm the result of the fine positioning, it is necessary to confirm that the relative relationship between the fine coordinates of the two search areas is the same as that at the time of setting at Step S31 within a predefined range (Step S37). Subsequently, the target center position (X, Y, θ) of the die Dm including rotation information is calculated from the fine coordinates of the two positions determined by fine positioning. Here, the number of reconfirmations of the search area can be 3 or more if the center position of the die Dm is more accurately calculated due to the reconfirmations (Step S38).

According to the embodiment and the abovementioned modifications, the following one or plural advantageous effects can be obtained.

(1) The center coordinate of a die can be calculated by detecting the dicing grooves of the die without executing a teaching.

(2) The center of a die can be moved to the center of a camera (center of an optical axis) by calculating the coordinate of the center of the die.

(3) The size of a die can be obtained by detecting the dicing grooves of the die.

(4) A judgment criterion for a pad candidate can be set by obtaining the center coordinate of a die and the size (shape) of the die.

(5) A pad candidate can be detected on the basis of the average shape of pads, or the areas, aspect ratios, and positions (coordinates) of blobs using template matching or binarization.

(6) Assuming that pads are disposed in a straight line, whether or not the pad candidate mentioned in (5) is a pad can be judged using the judgement criterion for a pad candidate mentioned in (4).

(7) A specific pad arrangement having a unique pitch can be identified and detected by calculating pad pitches in the disposition of pads disposed in a straight line.

(8) Since a detected pad arrangement is unique, the detected pad arrangement can automatically be registered as a template model.

(9) The teaching can be automatized by automatically registering template models.

(10) Variations in work by human beings can be eliminated by automatization, and judgement processes made by human beings can also be eliminated, so that quality can be stabilized. Here, the quality is considered to include, as qualities as the specifications of a device, the stability of positioning, the stable running of the device, the accuracies as the qualities of products manufactured by the device, and the like.

(11) The dicing grooves of a die that is thin and has a warpage can be detected by setting the size of an irradiation area in accordance with the size of the die using a coaxial illumination.

(12) Since a specific pad arrangement for each type of die can be registered in advance, after a pad arrangement is detected using an imaging device, data for the relevant type of die can be selected. Therefore, when a wafer is loaded, data for the relevant type of die can automatically selected.

Although the present disclosure achieved by the disclosers has been explained concretely on the basis of the embodiment and modifications so far, the present disclosure is not limited to the embodiment and modifications described above, and it goes without saying that various changes can be made to the present disclosure.

For example, although die appearance inspection recognition is executed after die position recognition in the embodiment, it is all right if the die position recognition is executed after the die appearance inspection recognition.

In addition, although a DAF is attached to the lower surface of a wafer in the embodiment, what is attached to the rear surface of the wafer does not necessarily have to be the DAF.

Furthermore, although the die bonder according to the embodiment includes one pickup head and one bonding head, it is all right if the die bonder includes two or more pickup heads and two or more bonding heads. In addition, although the die bonder according to the embodiment includes an intermediate stage, it is all right if there is no intermediate stage. In this case, it is conceivable that a type of head can be used for both pickup head and bonding head.

Furthermore, although a die is bonded with its upper surface up according to the embodiment, it is all right if the die is bonded with its lower surface up after the die is picked up and put upside down. In this case, the intermediate stage can be eliminated. A device configured in the above way is called a flip-flop bonder.

APPENDICES

Hereinafter, preferred aspects according to the present disclosure will be described.

Appendix 1

(a) A manufacturing method for a semiconductor apparatus comprising the steps of: carrying in a substrate to a die bonding apparatus including an imaging device for photographing a referential wafer having dicing grooves surrounding a die; an illumination device for irradiating the referential wafer with illumination lights; and a control device for controlling the imaging device and the illumination device, wherein the control device is configured to: detect the dicing grooves by photographing the referential wafer using the imaging device; roughly determine a central position of the die by calculating a center coordinate of the die on the basis of the detected dicing grooves; move a center of the die to a center of an optical axis of the imaging device on the basis of the center coordinate; photograph the moved die by the imaging device and detect positions of pads possessed by the die on the basis of an image of the photographed die; detect a specific pad arrangement having a unique pitch on the basis of the detected dispositions of the pads; and register the detected specific pad arrangement as a template model, (b) carrying in a wafer ring holder holding a dicing tape to which a product wafer having dicing grooves surrounding a die is attached, (c) picking up the die of the product wafer, and (d) bonding the picked-up die on a substrate or on a die already bonded on the substrate.

Appendix 2

The manufacturing method for a semiconductor apparatus according to Appendix 1,
wherein the abovementioned step (c) includes the step of cutting out a search area of the die on the product wafer photographed by the image device, specifying the position determined by positioning for the central position by performing matching processing between the search area and the template model, and correcting the pickup position of the die on the basis of the position determined by positioning.

Appendix 3

The manufacturing method for a semiconductor apparatus according to Appendix 1,
wherein the abovementioned step (c) includes:
the step of mounting the picked-up die on an intermediate stage; and
the step of cutting out the search area of the die, which is photographed by a second image device, on the intermediate stage, specifying the position determined by positioning for the central position by performing matching processing between the search area and the template model, and correcting the pickup position of the die on the basis of the position determined by positioning, and
the abovementioned step (d) includes: the step of picking up the die mounted on the intermediate stage.

Appendix 4

The manufacturing method for a semiconductor apparatus according to Appendix 1,
wherein the abovementioned step (d) includes the step of cutting out the search area of a die that is bonded on the substrate or on a die already bonded on the substrate and photographed by a third image device, specifying the position determined by positioning for the central position by performing matching processing between the search area and the template model, and correcting the pickup position of the die on the basis of the position determined by positioning.

What is claimed is:

1. A die bonding apparatus comprising:
an imaging device for photographing a wafer having dicing grooves surrounding a die;
an illumination device including a light emission section having a plane emission light source and a semi-transparent mirror for irradiating an upper surface of the die with an illumination light emitted from the light emission section so as to irradiate the die with the illumination light along an optical axis of the imaging device; and
a control device for controlling the imaging device and the illumination device,
wherein the illumination device is configured to adjust a light emitting surface size of the plane emission light source to limit an irradiation area of the light emission section in order to detect the dicing grooves by preventing light reflected from warpages formed in dice adjacent to the die from entering the image device, and
the control device is configured to:
irradiate an illumination light using the illumination device and at the same time detect the dicing grooves by photographing the wafer using the imaging device;
roughly determine a central position of the die by calculating a center coordinate of the die based on the detected dicing grooves;
move a center of the die to a center of the optical axis of the imaging device based on the center coordinate;
photograph again the moved die using the imaging device; and
determine a position determined by fine positioning for the central position by cutting out a search area of the die photographed again based on rough positioning and performing matching processing between the search area and a template specified in advance.

2. The die bonding apparatus according to claim 1, wherein the control device is configured to correct a position where the die is picked up based on the position determined by fine positioning.

3. The die bonding apparatus according to claim 1, wherein the light emission section of the illumination device includes a shading plate or a liquid crystal panel that sets an irradiation area in front of the plane emission light source.

4. The die bonding apparatus according to claim 1,
wherein the plane emission light source of the light emission section of the illumination device includes a plurality of LEDs, and
the control device is configured to set an irradiation area using turning-on and turning-off of the plurality of LEDs.

5. The die bonding apparatus according to claim 1,
wherein the light emitting surface size of the surface emitting light source is adjusted based on a die size.

6. The die bonding apparatus according to claim 5,
wherein the light emitting surface size of the surface emitting light source is further adjusted based on extent of the die.

7. The die bonding apparatus according to claim 1,
wherein the size of the light emitting surface of the surface emitting light source is such that light reflected by warpages of dice adjacent to the die and formed on the opposite side to the die does not enter the imaging device.

* * * * *